(12) United States Patent
Dong et al.

(10) Patent No.: US 11,468,840 B2
(45) Date of Patent: Oct. 11, 2022

(54) DRIVING BACKPLANE AND DISPLAY PANEL

(71) Applicant: BOE TECHNOLOGY GROUP CO., LTD., Beijing (CN)

(72) Inventors: Tian Dong, Beijing (CN); Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/119,171

(22) Filed: Dec. 11, 2020

(65) Prior Publication Data
US 2021/0183313 A1 Jun. 17, 2021

(30) Foreign Application Priority Data
Dec. 12, 2019 (CN) .......................... 201922220958.2

(51) Int. Cl.
*G09G 3/3258* (2016.01)
*G09G 3/3275* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC ............ H01L 27/3262; H01L 27/3276; G09G 3/3233; G09G 2300/0426
See application file for complete search history.

(56) References Cited

U.S. PATENT DOCUMENTS 11,183,122 B2 * 11/2021 Yang ..................... G09G 3/3233
2018/0190750 A1 * 7/2018 Choi ................... H01L 27/3262
2018/0218684 A1 * 8/2018 Choi ..................... G09G 3/3291

* cited by examiner

*Primary Examiner* — Sardis F Azongha
(74) *Attorney, Agent, or Firm* — Dority & Manning, P.A.

(57) ABSTRACT

Embodiments of the present disclosure provide a driving backplane and a display panel. The driving backplane has a plurality of sub-pixel regions, and includes: a base; a plurality of pixel driving circuits disposed on the base, one of the plurality of pixel driving circuits being disposed in one of the plurality of sub-pixel regions; and a plurality of data lines and a plurality of first power supply voltage lines disposed on the base. The pixel driving circuit is electrically connected to a data line and a first power supply voltage line. The data line and the first power supply voltage line are disposed on a side, away from the base, of the pixel driving circuit, and the data line and the first power supply voltage line are disposed at intervals in a same layer. An orthographic projection of the data line on the base overlaps with an orthographic projection of the pixel driving circuit on the base. The pixel driving circuit includes a driving transistor, a first switching transistor, and a first conductive pattern. The first conductive pattern is located on a side, away from the base, of the driving transistor and the first switching transistor. The first conductive pattern is electrically connected to a gate of the driving transistor through a first via. The first conductive pattern is electrically connected to a second electrode of the first switching transistor through a second via. An orthographic projection of the first conductive pattern on the base is located within an orthographic projection of the first power supply voltage line on the base.

17 Claims, 11 Drawing Sheets

(51) Int. Cl.
  *G09G 3/3266* (2016.01)
  *H01L 27/32* (2006.01)
  *H01L 27/12* (2006.01)
  *G09G 3/3233* (2016.01)

(52) U.S. Cl.
  CPC ....... *G09G 3/3275* (2013.01); *H01L 27/1214* (2013.01); *H01L 27/3262* (2013.01); *H01L 27/3265* (2013.01); *H01L 27/3276* (2013.01); *G09G 2300/0426* (2013.01); *G09G 2300/0842* (2013.01); *G09G 2310/0297* (2013.01)

DRIVING BACKPLANE AND DISPLAY PANEL

CROSS-REFERENCE TO RELATED APPLICATION

This application claims priority to Chinese Patent Application No. 201922220958.2, filed on Dec. 12, 2019, which is incorporated herein by reference in its entirety.

TECHNICAL HELD

The present disclosure relates to the field of display technologies, and in particular, to a driving backplane and a display panel.

BACKGROUND

At present, the market has a great demand for high frame rate display panels. With advantages such as small thickness, light weight, wide viewing angle, active light emission, continuously adjustable color, low cost, quick response, low energy consumption, low driving voltage, wide range of operating temperatures, simple production process, and high luminous efficiency, Active Matrix Organic Light-emitting Diode (AMOLED) has become a hot spot of technology for adoption in display products.

SUMMARY

Embodiments of the present disclosure provide a driving backplane and a display panel, which may improve a display effect of display panels.

In order to achieve the above purpose, the embodiments of the present disclosure adopt the following technical solutions.

In a first aspect, a driving backplane having a plurality of sub-pixel regions is provided. The driving backplane includes: a base; a plurality of pixel driving circuits disposed on the base, one of the plurality of pixel driving circuits being disposed in one of the plurality of sub-pixel regions: and a plurality of data lines and a plurality of first power supply voltage lines disposed on the base. The pixel driving circuit is electrically connected to a data line and a first power supply voltage line. The data line and the first power supply voltage line are disposed on a side, away from the base, of the pixel driving circuit, and the data line and the first power supply voltage line are disposed at intervals in a same layer. An orthographic projection of the data line on the base overlaps with an orthographic projection of the pixel driving circuit on the base. The pixel driving circuit includes: a driving transistor; a first switching transistor, and a first conductive pattern, the first conductive pattern being located on a side, away from the base, of the driving transistor and the first switching transistor. The first conductive pattern is electrically connected to a gate of the driving transistor through a first via. The first conductive pattern is electrically connected to a second electrode of the first switching transistor through a second via. An orthographic projection of the first conductive pattern on the base is located within an orthographic projection of the first power supply voltage line on the base.

In some embodiments, an active pattern of the first switching transistor includes at least one first channel region, and a first source region and a first drain region located on both sides of the at least one first channel region. A gate of the first switching transistor is disposed on a side, away from the base, of a corresponding first channel region, and an orthographic projection of the at least one first channel region on the base overlaps with an orthographic projection of the gate of the first switching transistor on the base; and a first electrode and a second electrode of the first switching transistor are served by portions of the active pattern of the first switching transistor that are located in the first source region and the first drain region. An orthographic projection of the second electrode of the first switching transistor on the base is located within the orthographic projection of the first power supply voltage line on the base.

In some embodiments, an active pattern of the driving transistor includes a second channel region, and a second source region and a second drain region located on both sides of the second channel region. An orthographic projection of the second channel region on the base overlaps with an orthographic projection of the gate of the driving transistor on the base, and a first electrode and a second electrode of the driving transistor are served by portions of the active pattern of the driving transistor that are located in the second source region and the second drain region. The active pattern of the driving transistor and the active pattern of the first switching transistor are disposed in a same layer.

In some embodiments, the pixel driving circuit further includes a capacitor and a second conductive pattern. The gate of the driving transistor is multiplexed as a first storage electrode of the capacitor. A second storage electrode of the capacitor is located on a side, away from the base, of the first storage electrode. The second conductive pattern is electrically connected to the second storage electrode through at least one third via, and the second conductive pattern is electrically connected to the first power supply voltage line through a fourth via. The second conductive pattern and the first conductive pattern are disposed in a same layer, and the first power supply voltage line is disposed on a side, away from the second storage electrode, of a layer where the second conductive pattern and the first conductive pattern are located. The second storage electrode is provided with a hollow region, and the first via is directly opposite to the hollow region.

In some embodiments, the fourth via includes a first sub-via and a second sub-via that are stacked in a thickness direction of the base; the second sub-via is located on a side, away from the base, of the first sub-via, and is communicated with the first sub-via; and a size of the second sub-via is greater than a size of the first sub-via. The second sub-via is disposed in an organic insulating layer, and the first sub-via is disposed in an inorganic insulating layer.

In some embodiments, sub-pixel regions in a same row in the plurality of sub-pixel regions, second storage electrodes of capacitors in pixel driving circuits of any adjacent sub-pixel regions are electrically connected to each other.

In some embodiments, the pixel driving circuit further includes a third conductive pattern. The first electrode of the first switching transistor is electrically connected to the third conductive pattern through a sixth via, the third conductive pattern is electrically connected to an initialization signal line through a seventh via, and the initialization signal line and the second storage electrode are disposed in a same layer. The third conductive pattern and the second conductive pattern are disposed in a same layer.

In some embodiments, the pixel driving circuit further includes a second switching transistor and a fourth conductive pattern. A gate of the second switching transistor is served by a gate line, and the gate line and the gate of the driving transistor are disposed in a same layer. An active pattern of the second switching transistor includes a third channel region, and a third source region and a third drain region located on both sides of the third channel region. An orthographic projection of the gate of the second switching transistor on the base overlaps with an orthographic projection of the third channel region on the base, and a first electrode and a second electrode of the second switching transistor are served by portions of the active pattern of the second switching transistor that are located in the third source region and the third drain region. The first electrode of the second switching transistor is electrically connected to the fourth conductive pattern through an eighth via, and the fourth conductive pattern is electrically connected to the data line through a ninth via. The second electrode of the second switching transistor and the first electrode of the driving transistor are connected and formed as an integral structure. The fourth conductive pattern is disposed in a same layer as the first conductive pattern and the second conductive pattern.

In some embodiments, the ninth via includes a third sub-via and a fourth sub-via that are stacked in a thickness direction of the base. The fourth sub-via is located on a side, away from the base, of the third sub-via, and is communicated with the third sub-via; and a size of the fourth sub-via is greater than a size of the third sub-via. The fourth sub-via is disposed in an organic insulating layer, and the third sub-via is disposed in an inorganic insulating layer.

In some embodiments, the pixel driving circuit further includes a third switching transistor. A gate of the third switching transistor is served by the gate line. An active pattern of the third switching transistor includes a fourth channel region, and a fourth source region and a fourth drain region located on both sides of the fourth channel region. An orthographic projection of the gate of the third switching transistor on the base overlaps with an orthographic projection of the fourth channel region on the base, and a first electrode and a second electrode of the third switching transistor are served by portions of the active pattern of the third switching transistor that are located in the fourth source region and the fourth drain region. The first electrode of the third switching transistor and the second electrode of the driving transistor are connected and formed as an integral structure. The second electrode of the third switching transistor and the second electrode of the first switching transistor are connected and formed as an integral structure.

In some embodiments, the pixel driving circuit further includes a fourth switching transistor. A gate of the fourth switching transistor is served by a light-emitting control line, and the light-emitting control line is disposed in a same layer as the gate of the driving transistor. An active pattern of the fourth switching transistor includes a fifth channel region, and a fifth source region and a fifth drain region located on both sides of the fifth channel region. An orthographic projection of the gate of the fourth switching transistor on the base overlaps with an orthographic projection of the fifth channel region on the base, and a first electrode and a second electrode of the fourth switching transistor are served by portions of the active pattern of the fourth switching transistor that are located in the fifth source region and the fifth drain region. The first electrode of the fourth switching transistor is electrically connected to the second conductive pattern through an eleventh via. The second electrode of the fourth switching transistor and the first electrode of the driving transistor are connected and formed as an integral structure.

In some embodiments, the pixel driving circuit further includes a fifth switching transistor, a fifth conductive pattern, and a sixth conductive pattern, A gate of the fifth switching transistor is served by the light-emitting control line. An active pattern of the fifth switching transistor includes a sixth channel region, and a sixth source region and a sixth drain region located on both sides of the sixth channel region. An orthographic projection of the gate of the fifth switching transistor on the base overlaps with an orthographic projection of the sixth channel region on the base, and a first electrode and a second electrode of the fifth switching transistor are served by portions of the active pattern of the fifth switching transistor that are located in the sixth source region and the sixth drain region. The first electrode of the fifth switching transistor and the second electrode of the driving transistor are connected and are formed as an integral structure. The second electrode of the fifth switching transistor is electrically connected to the fifth conductive pattern through a twelfth via, and the fifth conductive pattern is electrically connected to the sixth conductive pattern through a thirteenth via. The sixth conductive pattern is configured to be electrically connected to a light-emitting device. The fifth conductive pattern and the second conductive pattern are disposed in a same layer. The sixth conductive pattern is disposed in a same layer as the data line and the first power supply voltage line.

In some embodiments, the pixel driving circuit further includes a sixth switching transistor, A gate of the sixth switching transistor is served by a reset signal line. An active pattern of the sixth switching transistor includes a seventh channel region, and a seventh source region and a seventh drain region located on both sides of the seventh channel region. An orthographic projection of the gate of the sixth switching transistor on the base overlaps with an orthographic projection of the seventh channel region on the base, and a first electrode and a second electrode of the sixth switching transistor are served by portions of the active pattern of the sixth switching transistor that are located in the seventh source region and the seventh drain region. The first electrode of the sixth switching transistor and the first electrode of the first switching transistor are connected and formed as an integral structure. In Sub-pixel regions in a same column in the plurality of sub-pixel regions, except for sub-pixel regions in a first row, second electrodes of sixth switching transistors in pixel driving circuits of sub-pixel regions in each row and second electrodes of fifth switching transistors in pixel driving circuits of sub-pixel regions in a previous row are connected and formed as integral structures.

In some embodiments, except for sub-pixel regions in the first row, a reset signal line electrically connected to the pixel driving circuits of sub-pixel regions in each row is shared with a gate line electrically connected to the pixel driving circuits of sub-pixel regions in the previous row.

In some embodiments, pixel driving circuits of sub-pixel regions in a same column in the plurality of sub-pixel regions are electrically connected to two data lines. A first power supply voltage line electrically connected to the pixel driving circuits of sub-pixels in the same column is located between the two data lines.

In some embodiments, one of the two data lines is electrically connected to pixel driving circuits of sub-pixel regions in odd rows of sub-pixel regions in the same column, and another of the two data lines is electrically connected to pixel driving circuits of sub-pixel regions in even rows of sub-pixel regions in the same column.

In some embodiments, pixel driving circuits in any adjacent sub-pixel regions of sub-pixel regions in a same row are arranged in mirror symmetry.

In a second aspect, a display panel is provided. The display panel includes the driving backplane described above and a light-emitting device disposed in each of the plurality of sub-pixel regions on the driving backplane. The light-emitting device is electrically connected to the pixel driving circuit.

In some embodiments, the driving backplane further has a peripheral region. The display panel further includes a scan driver, a light-emitting driver, a data driver, a timing controller, and a plurality of multiplexers disposed in the peripheral region. Each of the plurality of multiplexers corresponds to pixel driving circuits of sub-pixel regions in a column in the plurality of sub-pixel regions. The scan driver is electrically connected to a plurality of gate lines and the timing controller, and the scan driver is configured to output gate scan signals to the plurality of gate lines one by one in response to a signal received from the timing controller. The light-emitting driver is electrically connected to a plurality of light-emitting control lines and the timing controller, and the light-emitting driver is configured to output light-emitting control signals to the light-emitting control lines one by one in response to the signal received from the timing controller. The data driver is electrically connected to the plurality of multiplexers and the timing controller, and the data driver is configured to output data signals to the plurality of multiplexers in response to the signal received from the timing controller. Each of the plurality of multiplexers is further electrically connected to the timing controller and two data lines that are electrically connected to pixel driving circuits of sub-pixel regions in a same column corresponding to each of the plurality of multiplexers, and each of the plurality of multiplexers is configured to transmit a data signal from the data driver to one of the two data lines and another of the two data lines in different time periods in response to the signal received from the timing controller.

BRIEF DESCRIPTION OF THE DRAWINGS

In order to describe technical solutions in embodiments of the present disclosure more clearly, accompanying drawings to be used in the description of the embodiments will be introduced briefly. Obviously, the accompanying drawings to be described below are merely some embodiments of the present disclosure, and a person of ordinary skill in the art may obtain other drawings according to these drawings without paying any creative effort.

DETAILED DESCRIPTION

Figure 1:
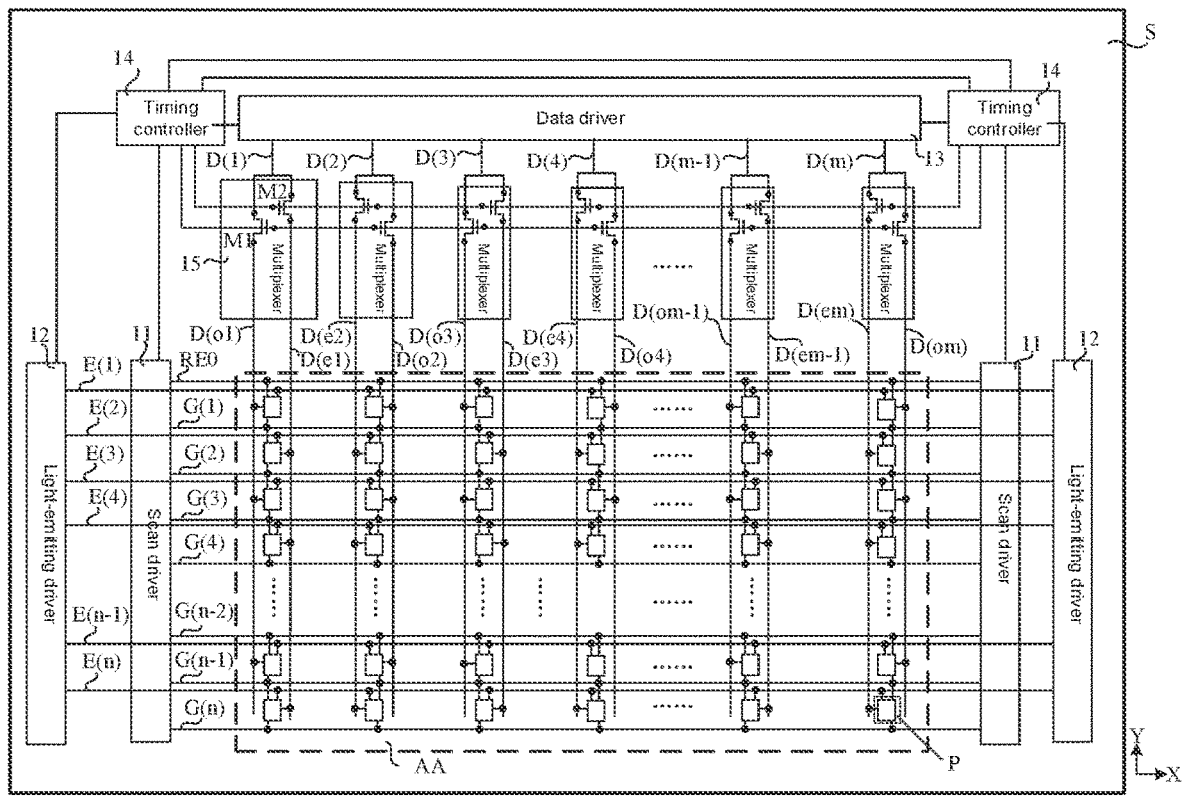
FIG. 1 is a schematic diagram showing a structure of a display panel, in accordance with some embodiments.

Technical solutions in embodiments of the present disclosure will be described clearly and completely in combination with accompanying drawings in the embodiments of the present disclosure. However, the described embodiments are merely some but not all embodiments of the present disclosure. All other embodiments obtained based on the embodiments of the present disclosure by a person of ordinary skill in the art without paying any creative effort shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

The term "one or more" or "at least one" as used herein, at least in part depending on the context, can be used to describe any feature, structure, or characteristic in the singular, or can be used to describe a feature, structure, or characteristic in the plural. At least in part depending on the context, terms such as "one" or "the" will be understood in the singular sense or in the plural sense. In the description herein, "a plurality of/the plurality of" means two or more unless otherwise specified.

The terms such as "first" and "second" are used for descriptive purposes only, and are not to be construed as indicating or implying relative importance or implicitly indicating the number of indicated technical features. Therefore, features defined as "first" and "second" may explicitly or implicitly include one or more of the features.

The description that A and B are disposed in a same layer means that A and B are disposed on a surface of a same film layer. The description that A and B are disposed in a same layer and made of a same material means that A and B are layer structures formed through a patterning process by using a same mask to pattern film layers for forming specific patterns that are formed through a same film formation process based on a same bearing surface. The patterning process may include exposure, development and/or etching processes. The specific patterns in the formed layer structures may be continuous or discontinuous, and these specific patterns may also be at different heights or have different thicknesses.

In the description of embodiments herein, it will be understood that orientations or positional relationships indicated by terms "center", "upper", "lower", "front", "rear", "left", "right", "vertical", "horizontal", "top", "bottom", "inner", "outer", etc. are based on orientations or positional relationships shown in the drawings, merely to facilitate and simplify the description of the present disclosure, instead of to indicate or imply that the referred devices or elements must have a particular orientation, or must be constructed or operated in a particular orientation. Therefore, they should not be construed as limitations to the present disclosure.

Some embodiments of the present disclosure provide a display panel. As shown in FIG. 1, the display panel includes a driving backplane. Wherein, the driving backplane has a display area AA and a peripheral region S. The peripheral region S is located on at least one side of the AA, For example, the peripheral region S may be disposed around the AA.

Figure 2:
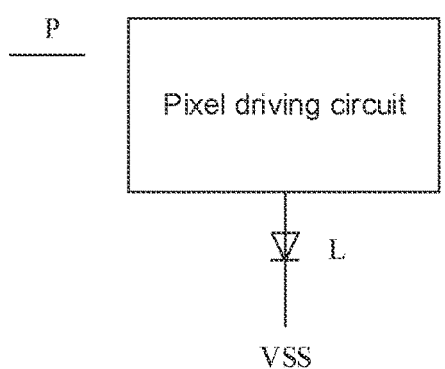
FIG. 2 is a schematic diagram showing a structure of a sub-pixel region, in accordance with some embodiments.

The display area AA has a plurality of sub-pixel regions P. FIG. 2 is a schematic diagram showing a structure of a sub-pixel region P in accordance with some embodiments.

FIG. 1 is an illustration by taking an example in which the plurality of sub-pixel regions P are arranged in an array of n rows and m columns, n and m being both positive integers, but embodiments of the present invention are not limited thereto, and the plurality of sub-pixel regions P may be arranged in other manners. In the embodiments of the present disclosure, all structures located in each sub-pixel region P as a whole are referred to as a sub-pixel.

Figure 3:
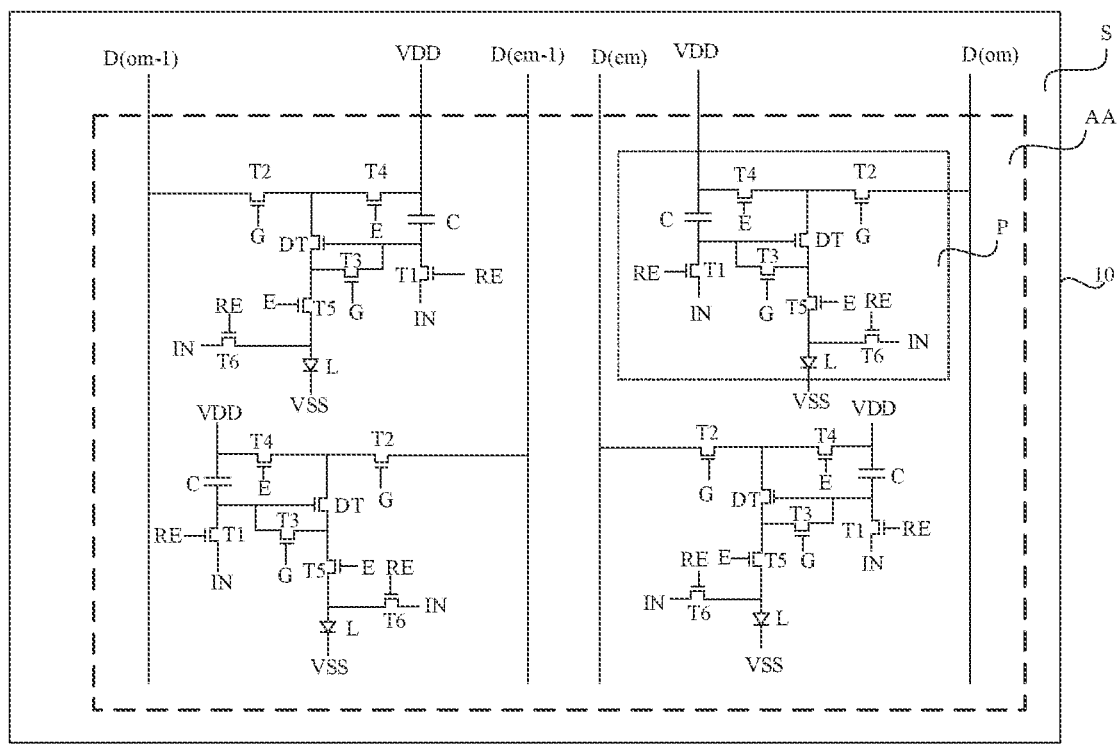
FIG. 3 is a schematic diagram showing a structure of a driving backplane, in accordance with some embodiments.

As shown in FIG. 3, the driving backplane includes a base 10; a plurality of pixel driving circuits disposed on the base 10, one of the plurality of pixel driving circuits being disposed in a sub-pixel region P; and a plurality of data lines D and a plurality of first power supply voltage lines VDD disposed on the base 10. As shown in FIG. 3, the pixel driving circuit is electrically connected to a data line D and a first power supply voltage line VDD.

For example, one pixel driving circuit is electrically connected to one data line D and one first power supply voltage line VDD. It will be noted that, each data line D and each first power supply voltage line VDD are not only connected to one pixel driving circuit. Pixel driving circuits connected to the data line D may be the same as pixel driving circuits connected to the first power supply voltage line VDD. For example, the data line D and the first power supply voltage line VDD are both connected to pixel driving circuits of sub-pixel regions P in a column. Of course, the pixel driving circuits connected to the data line D may not be exactly the same as the pixel driving circuits connected to the first power supply voltage line VDD. For example, the data line D is connected to pixel driving circuits of sub-pixel regions P in odd rows of sub-pixel regions P in a column, and the first power supply voltage line VDD is connected to all pixel driving circuits of sub-pixel regions P in the column. That is, all pixel driving circuits of sub-pixel regions in an i-th column are electrically connected to two data lines D; pixel driving circuits of sub-pixel regions in odd rows are electrically connected to one data line D(om) of the two data lines D, and pixel driving circuits of sub-pixel regions in even rows are electrically connected to another data line D(em) of the two data lines D. All the pixel driving circuits of sub-pixel regions in the i-th column are connected to a same first power supply voltage line VDD. Herein, i is a positive integer greater than or equal to 1 and less than or equal to m.

The data line D and the first power supply voltage line VDD are disposed on a side of the pixel driving circuit away from the base 10, and the data line D and the first power supply voltage line VDD are disposed at intervals in a same layer. Orthographic projections of the data line D and the first power supply voltage line VDD on the base 10 overlap with an orthographic projection of the pixel driving circuit on the base 10.

In some examples, the data line D and the first power supply voltage line VDD are made of a same material, and are both made of a metal material. In this case, the data line D and the first power supply voltage line VDD are disposed in a same layer and made of the same material.

In some examples, the data line D and the first power supply voltage line VDD extend in a same direction.

Figure 4:
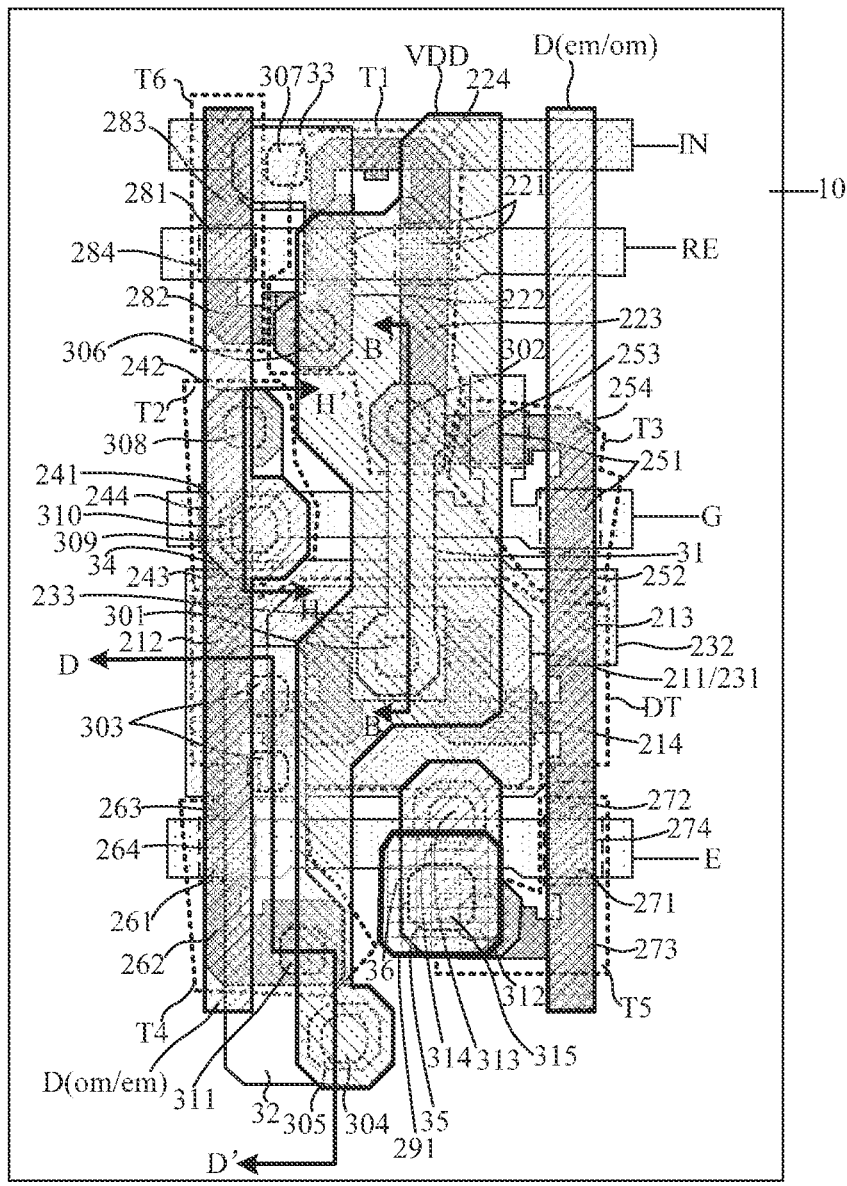
FIG. 4 is a schematic diagram showing a structure of another driving backplane, in accordance with some embodiments.

As shown in FIGS. 3 and 4, the pixel driving circuit includes a driving transistor DT, a first switching transistor T1, and a first conductive pattern 31. The first conductive pattern 31 is located on a side of the driving transistor DT and the first switching transistor T1 away from the base 10. In some examples, the first conductive pattern 31 is disposed between the first power supply voltage line VDD and both the driving transistor DT and the first switching transistor T1.

Figure 5:
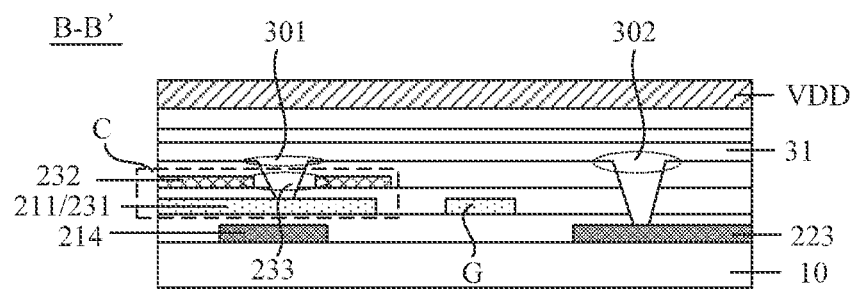
FIG. 5 is schematic sectional view of the driving backplane in FIG. 4 taken along direction B-B'.

As shown in FIGS. 4 and 5, the first conductive pattern 31 is electrically connected to a gate 211 of the driving transistor DT through a first via 301. The first conductive pattern 31 is electrically connected to a second electrode 223 of the first switching transistor T1 through a second via 302. An orthographic projection of the first conductive pattern 31 on the base 10 is located within an orthographic projection of the first power supply voltage line VDD on the base 10.

In some examples, as shown in the figures, the driving transistor DT is a top-gate transistor, and the first switching transistor T1 is a double-gate transistor. That is, the first switching transistor T1 includes two gates 221. In some other examples, the driving transistor DT and the first switching transistor T1 are both top-gate transistors. In some other examples, the driving transistor DT and the first switching transistor T1 are both bottom-gate transistors.

It will be understood that, the first via 301 is disposed in at least one first insulating layer between the first conductive pattern 31 and the gate 211 of the driving transistor DT, and the first via 301 passes through the at least one first insulating layer. The second via 302 is disposed in at least one second insulating layer between the first conductive pattern 31 and the second electrode 223 of the first switching transistor T1, and the second via 302 passes through the at least one second insulating layer. The at least one first insulating layer and the at least one second insulating layer are identical; or, the at least one first insulating layer includes at least one second insulating layer and at least one other insulating layer; or, the at least one second insulating layer includes at least one first insulating layer and at least one other insulating layer.

In the driving backplane provided by some embodiments of the present disclosure, the pixel driving circuit includes the driving transistor DT, the at least one first switching transistor T1, and the first conductive pattern 31. The first conductive pattern 31 is electrically connected to the gate 211 of the driving transistor DT, and the first conductive pattern 31 is electrically connected to the second electrode 223 of the first switching transistor T1. That is, the gate 211 of the driving transistor DT is electrically connected to the second electrode 223 of the first switching transistor T1 through the first conductive pattern 31. Therefore, both the first conductive pattern 31 and the second electrode 223 of the first switching transistor T1 may be regarded as the gate 211 of the driving transistor DT. In this case, since the first power supply voltage line VDD and the data line D are disposed in the same layer and are both made of a metal material, and the orthographic projection of the first conductive pattern 31 on the base 10 is located within the orthographic projection of the first power supply voltage line VDD on the base 10, a parasitic capacitance between the data line D and the gate 211 of the driving transistor DT is shielded, and an influence of a signal of the data line D on the gate 211 of the driving transistor DT may be reduced, so that a risk of a signal coupling between the data line D and the gate 211 of the driving transistor DT may be avoided, and a display effect of the display panel may be improved.

Figure 6:
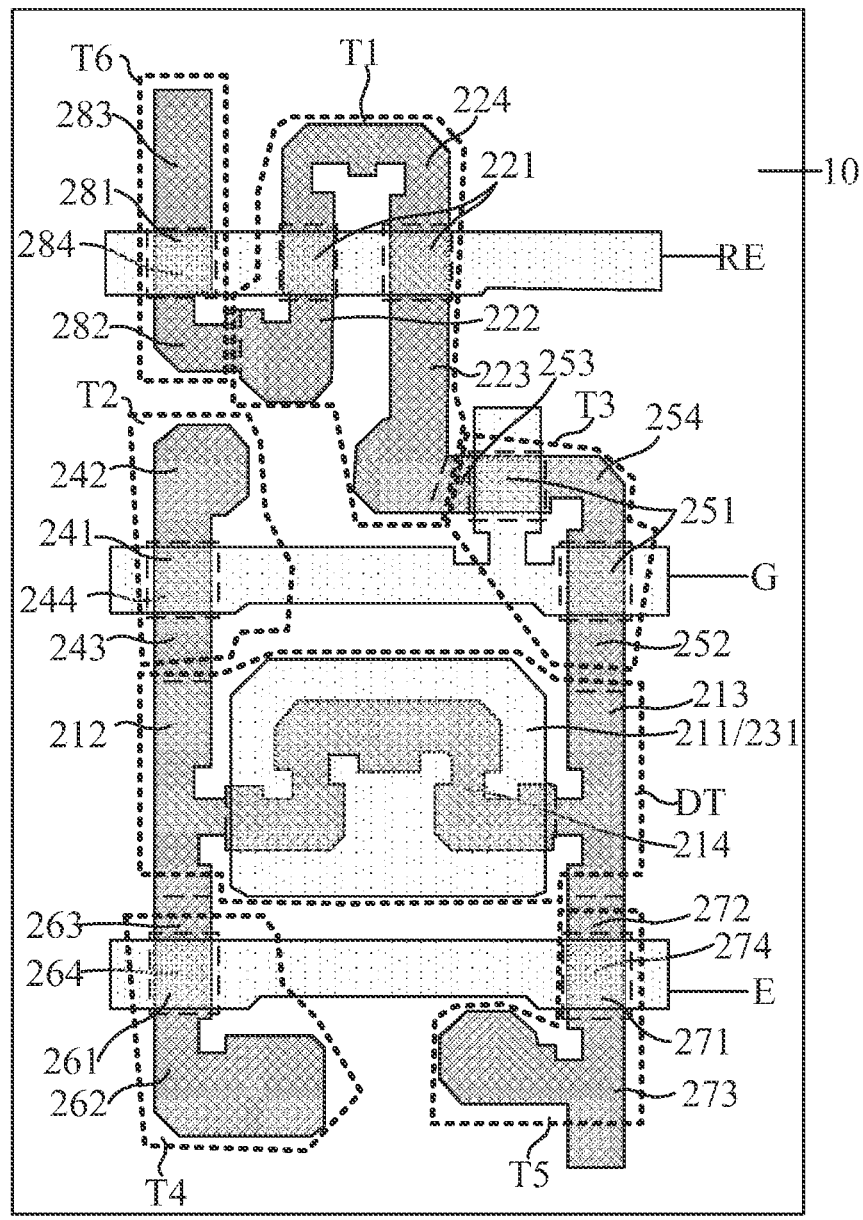
FIG. 6 is a schematic diagram showing a structure of yet another driving backplane, in accordance with some embodiments.

In some embodiments, as shown in FIG. 6, an active pattern 224 of the first switching transistor T1 includes: at least one first channel region, and a first source region and a first drain region located on both sides of the at least one first channel region. Each gate 221 of the first switching transistor T1 is disposed on a side of a corresponding first channel region away from the base 10, and an orthographic projection of the at least one first channel region on the base overlaps with an orthographic projection of the gate 221 of the first switching transistor T1 on the base 10. A first electrode 222 and the second electrode 223 of the first switching transistor T1 are respectively served by portions of the active pattern 224 of the first switching transistor T1 that are located in the first source region and the first drain region. As shown in FIGS. 4 and 5, an orthographic projection of the second electrode 223 of the first switching transistor T1 on the base 10 is located within the orthographic projection of the first power supply voltage line VDD on the base 10.

Here, in a case where the at least one first channel region includes a single first channel region, the first switching transistor T1 is a top-gate transistor. As shown in FIG. 6, in a case where the at least one first channel region includes two first channel regions, the first switching transistor T1 is a double-gate transistor, and correspondingly, there are two gates 221 and they are electrically connected to each other. In this case, the active pattern 224 of the first switching transistor T1 further includes a connection portion located between the two first channel regions.

Since the gate 211 of the driving transistor DT is electrically connected to the second electrode 223 of the first switching transistor T1 through the first conductive pattern 31, both the first conductive pattern 31 and the second electrode 223 of the first switching transistor T1 may be regarded as the gate 211 of the driving transistor DT. Since the first power supply voltage line VDD and the data line D are disposed in the same layer and are both made of a metal material, and the orthographic projections of the first conductive pattern 31 and the second electrode 223 of the first switching transistor T1 on the base 10 are located within the orthographic projection of the first power supply voltage line VDD on the base 10, the parasitic capacitance between the data line D and the gate 211 of the driving transistor DT is shielded and the influence of the signal of the data line D on the gate 211 of the driving transistor DT may be reduced, so that the risk of signal coupling between the data line D and the gate 211 of the driving transistor DT may be avoided.

As shown in FIG. 6, in some embodiments, an active pattern 214 of the driving transistor DT includes a second channel region, and a second source region and a second drain region located on both sides of the second channel region. An orthographic projection of the second channel region on the base 10 overlaps with an orthographic projection of the gate 211 of the driving transistor DT on the base 10. A first electrode 212 and a second electrode 213 of the driving transistor DT are served by portions of the active pattern 214 of the driving transistor DT that are located in the second source region and the second drain region. The active pattern 214 of the driving transistor DT and the active pattern 224 of the first switching transistor T1 are disposed in a same layer. That is, the driving transistor DT is a top-gate transistor.

In this way, the active pattern 214 of the driving transistor DT and the active pattern 224 of the first switching transistor T1 may be formed through one-time patterning process, and the gate 211 of the driving transistor DT and the gate 221 of the first switching transistor T1 may be formed through one-time patterning process.

For example, materials of the active pattern 214 of the driving transistor DT and the active pattern 224 of the first switching transistor T1 are both polysilicon (P—Si).

In a case where the first electrode 212 of the driving transistor DT is a source and the second electrode 213 of the driving transistor DT is a drain, the first electrode 212 of the driving transistor DT is served by a portion of the active pattern 214 of the driving transistor DT that is located in the second source region, and the second electrode 213 of the driving transistor DT is served by a portion of the active pattern 214 of the driving transistor DT that is located in the second drain region. In a case where the first electrode 212 of the driving transistor DT is a drain and the second electrode 213 of the driving transistor DT is a source, the first electrode 212 of the driving transistor DT is served by the portion of the active pattern 214 of the driving transistor DT that is located in the second drain region, and the second electrode 213 of the driving transistor DT is served by the portion of the active pattern 214 of the driving transistor DT that is located in the second source region.

Similarly, in a case where the first electrode 222 of the first switching transistor T1 is a source and the second electrode 223 of the first switching transistor T1 is a drain, the first electrode 222 of the first switching transistor T1 is served by a portion of the active pattern 224 of the first switching transistor T1 that is located in the first source region, and the second electrode 223 of the first switching transistor T1 is served by a portion of the active pattern 224 of the first switching transistor T1 that is located in the first drain region. In a case where the first electrode 222 of the first switching transistor T1 is a drain and the second electrode 223 of the first switching transistor T1 is a source, the first electrode 222 of the first switching transistor T1 is served by the portion of the active pattern 224 of the first switching transistor T1 that is located in the first drain region, and the second electrode 223 of the first switching transistor T1 is served by the portion of the active pattern 224 of the first switching transistor T1 that is located in the first source region.

Figure 7:
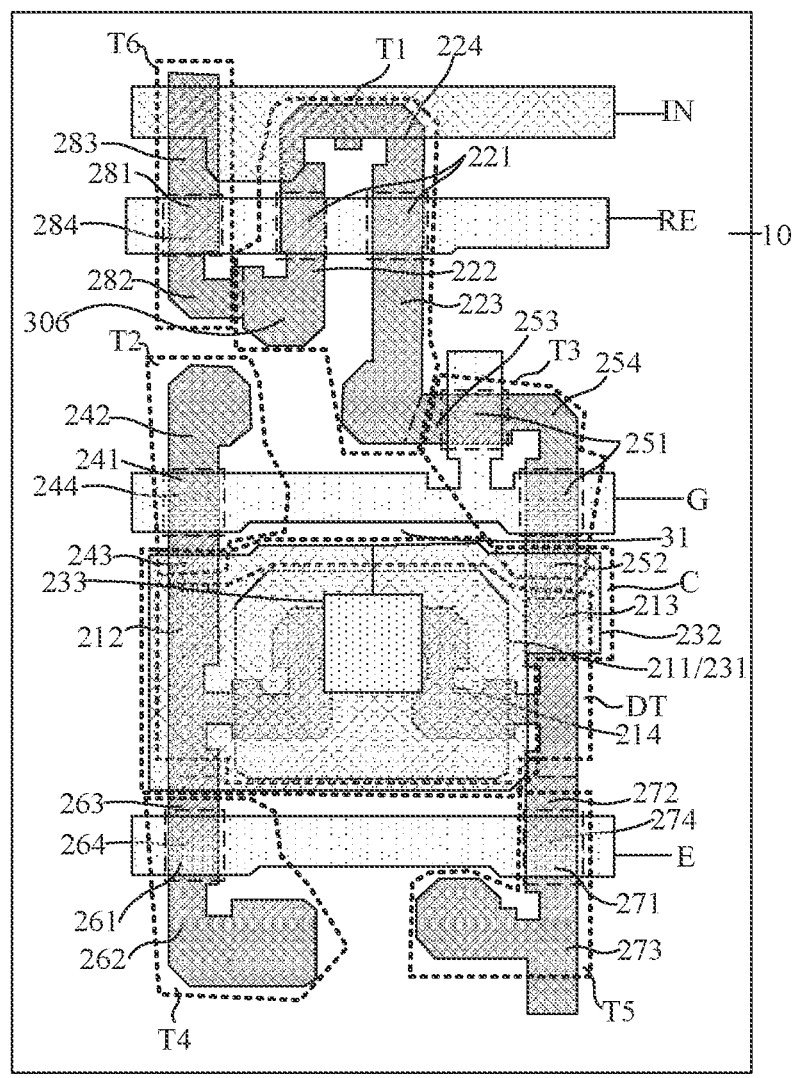
FIG. 7 is a schematic diagram showing a structure of yet another driving backplane, in accordance with some embodiments.

In some embodiments, as shown in FIG. 7, the pixel driving circuit further includes a capacitor C. The gate 211 of the driving transistor DT is multiplexed as a first storage electrode 231 of the capacitor C. A second storage electrode 232 of the capacitor C is located on a side of the first storage electrode 231 away from the base 10.

Figure 8:
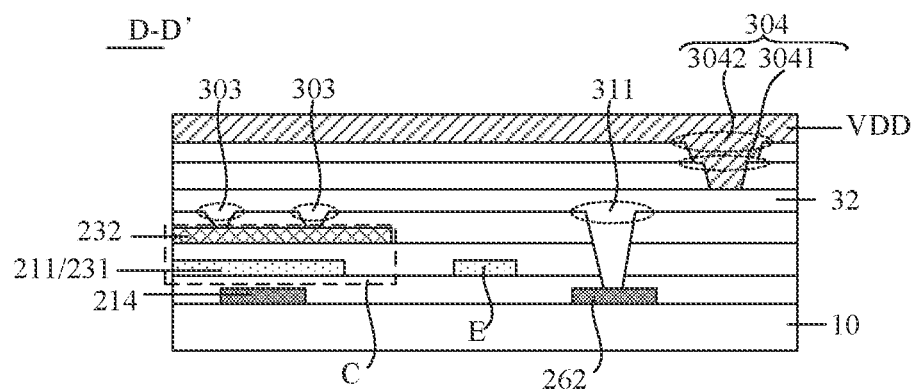
FIG. 8 is schematic sectional view of the driving backplane in FIG. 4 taken along direction D-D'.

As shown in FIG. 8, the pixel driving circuit further includes a second conductive pattern 32. The second conductive pattern 32 is electrically connected to the second storage electrode 232 through at least one third via 303, and the second conductive pattern 32 is electrically connected to the first power supply voltage line VDD through a fourth via 304. FIG. 8 is an illustration by taking an example in which the second conductive pattern 32 is electrically connected to the second storage electrode 232 through two third vias 303, but the embodiments of the present disclosure are not limited thereto. Those skilled in the art may set the number of the third vias 303 according to an area of a portion of the second conductive pattern 32 that overlaps with the second storage electrode 232 of the capacitor C, so as to reduce a contact resistance.

It will be understood that, the third via 303 passes through an insulating layer located between the second conductive pattern 32 and the second storage electrode 232 of the capacitor C.

The first power supply voltage line VDD is electrically connected to the second conductive pattern 32, and the second conductive pattern 32 is electrically connected to the second storage electrode 232 of the capacitor C. That is, the first power supply voltage line VDD is electrically connected to the second storage electrode 232 through the second conductive pattern 32. Therefore, all signals from the first power supply voltage line VDD may be transmitted to the second conductive pattern 32 and the second storage electrode 232 of the capacitor C.

In addition, the second conductive pattern 32 and the first conductive pattern 31 are disposed in a same layer, and the first power supply voltage line VDD is disposed on a side, away from the second storage electrode 232, of a layer where the second conductive pattern 32 and the first conductive pattern 31 are located.

As shown in FIGS. 4, 5 and 7, the second storage electrode 232 of the capacitor C is provided with a hollow region 233, and the first via 301 is directly opposite to the hollow region 233. Here, a size of the first via 301 is less than a size of the hollow region 233. Since the second storage electrode 232 is located between the first storage electrode 231 (i.e., the gate 211 of the driving transistor DT) and the layer where the second conductive pattern 32 and the first conductive pattern 31 are located, in order to cause the first conductive pattern 31 to be electrically connected to the gate 211 of the driving transistor DT through the first via 301, and avoid a short circuit between the first conductive pattern 31 and the second storage electrode 232, the hollow region 233 may be provided in the second storage electrode 232, and the first via 301 may be arranged directly opposite to the hollow region 233.

In some embodiments, as shown in FIG. 8, the fourth via 304 includes a first sub-via 3041 and a second sub-via 3042 that are stacked in a thickness direction of the base 10. The second sub-via 3042 is located on a side, away from the base 10, of the first sub-via 3041, and is communicated with the first sub-via 3041. A size of the second sub-via 3042 is larger than a size of the first sub-via 3041.

There are two insulating layers between the second conductive pattern 32 and the first power supply voltage line VDD. In the two insulating layers, an insulating layer proximate to the base 10 is an inorganic insulating layer, and an insulating layer away from the base 10 is an organic insulating layer. Therefore, the first sub-via 3041 passes through the inorganic insulating layer, and the second sub-via 3042 penetrates the organic insulating layer.

In some embodiments, in sub-pixel regions in a same row in the plurality of sub-pixel regions, second storage electrodes 232 of capacitors C in pixel driving circuits of any adjacent sub-pixel regions are electrically connected to each other.

Figure 9:
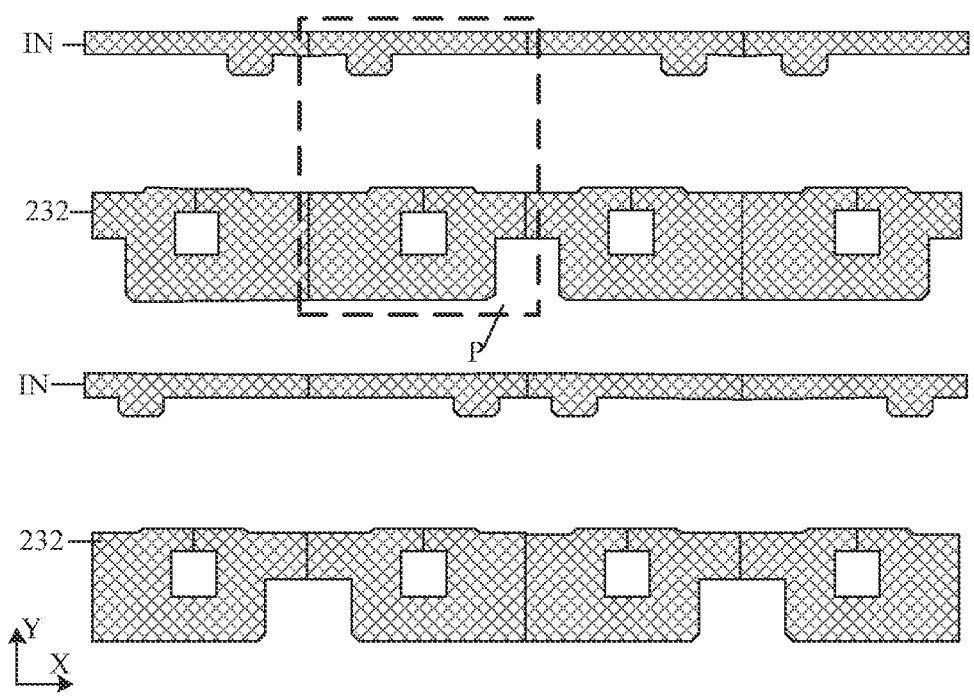
FIG. 9 is a schematic diagram showing a structure of yet another driving backplane, in accordance with some embodiments.

For example, as shown in FIG. 9, sub-pixel regions P arranged in a row in a horizontal direction X are referred to as sub-pixels in a same row, and in the sub-pixels in the same row, the second storage electrodes 232 of the capacitors C in the pixel driving circuits of any adjacent sub-pixel regions are electrically connected in the horizontal direction X.

The first power supply voltage line VDD is electrically connected to the second storage electrode 232 of the capacitor C through the second conductive pattern 32, so that the signal from the first power supply voltage line VDD may be transmitted to the second storage electrode 232 of the capacitor C. Therefore, the second storage electrode 232 of the capacitor C may be regarded as the first power supply voltage line VDD, and a first power supply voltage line VDD formed by the second storage electrode 232 of the capacitor C extends in a row direction of the sub-pixel regions.

Therefore, the first power supply voltage lines VDD are arranged in a grid in the row direction and column direction of the sub-pixel regions, and first power supply voltage lines VDD extending in the row direction are electrically connected to first power supply voltage lines VDD extending in the column direction. In addition, the first power supply voltage lines VDD extending in the row direction may be able to reduce resistances of the first power supply voltage lines VDD extending in the column direction, thereby reducing a voltage drop of the first power supply voltage lines VDD.

Figure 10:
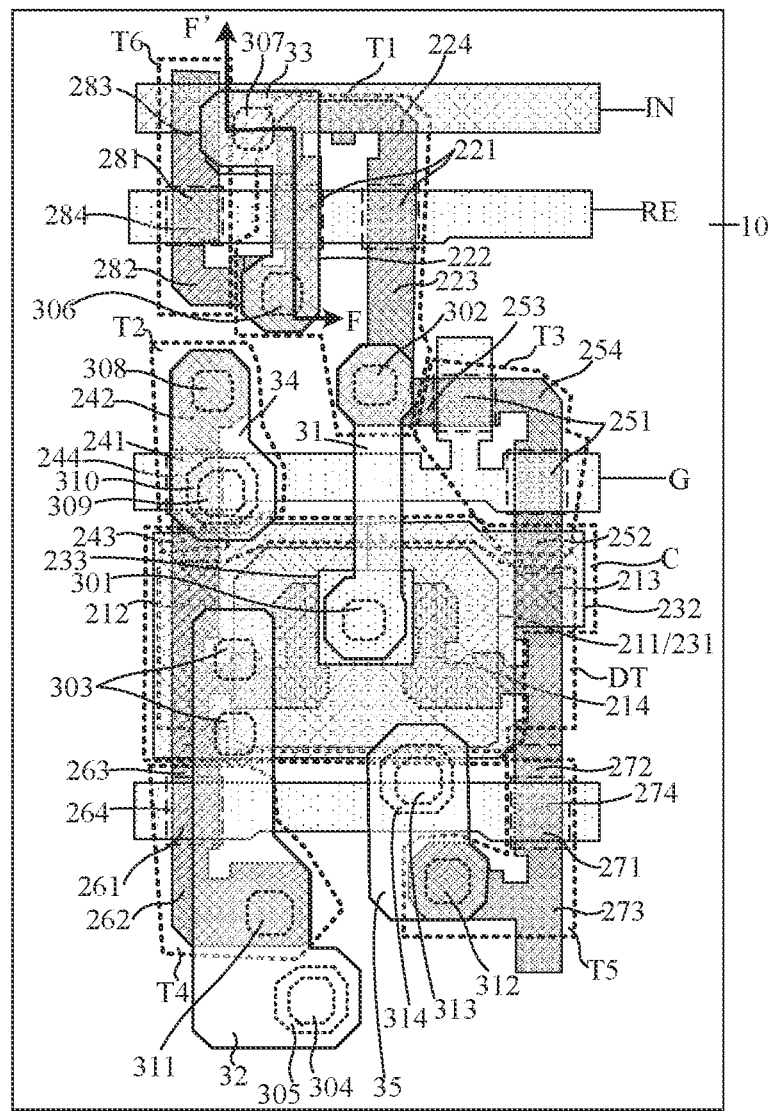
FIG. 10 is a schematic diagram showing a structure of yet another driving backplane, in accordance with some embodiments.

In some embodiments, as shown in FIG. 10, the pixel driving circuit further includes a third conductive pattern 33.

Figure 11:
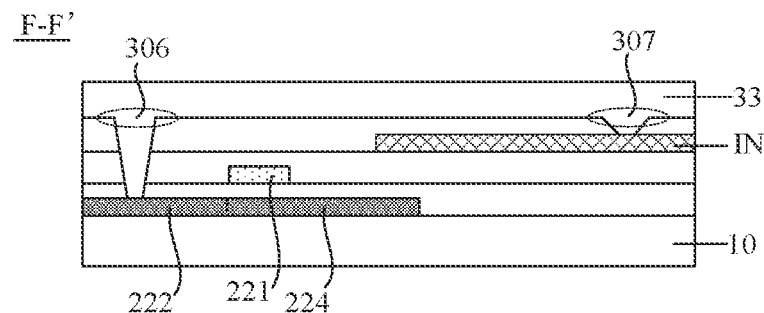
FIG. 11 is schematic sectional view of the driving backplane in FIG. 10 taken along direction F-F.

As shown in FIGS. 10 and 11, the first electrode 222 of the first switching transistor T1 is electrically connected to the third conductive pattern 33 through a sixth via 306, and the third conductive pattern 33 is electrically connected to an initialization signal line IN through a seventh via 307. The initialization signal line IN and the second electrode 232 of the capacitor C are disposed in a same layer. The third conductive pattern 33 and the second conductive pattern 32 are disposed in a same layer.

The gate 221 of the first switching transistor T1 is served by a reset signal line RE.

For example, a portion of the reset signal line RE that overlaps with the orthographic projection of the active pattern 224 of the first switching transistor T1 on the base 10 serves as the gate 221 of the first switching transistor T1, Therefore, the first switching transistor T1 may be turned on or off under the control of the reset signal line RE.

Since the first electrode 222 of the first switching transistor T1 is electrically connected to the third conductive pattern 33, and the third conductive pattern 33 is electrically connected to the initialization signal line IN, the first electrode 222 of the first switching transistor T1 is electrically connected to the initialization signal line IN through the third conductive pattern 33, a signal from the initialization signal line IN may be transmitted to the third conductive pattern 33 and the first electrode 222 of the first switching transistor T1. Since the second electrode 223 of the first switching transistor T1 is electrically connected to the gate 211 of the driving transistor DT through the first conductive pattern 31 the signal from the initialization signal line IN may be transmitted to the gate 211 of the driving transistor DT to initialize the gate 211 of the driving transistor DT, when the first switching transistor T1 is turned on.

In some embodiments, as shown in FIG. 10, the pixel driving circuit further includes a second switching transistor T2 and a fourth conductive pattern 34.

In some embodiments, an active pattern 244 of the second switching transistor T2 includes a third channel region, and a third source region and a third drain region located on both sides of the third channel region. An orthographic projection of a gate 241 of the second switching transistor T2 on the base 10 overlaps with an orthographic projection of the third channel region on the base 10, and a first electrode 242 and a second electrode 243 of the second switching transistor T2 are respectively served by portions of the active pattern 244 of the second switching transistor T2 that are located in the third source region and the third drain region.

The active pattern 244 of the second switching transistor T2 is disposed in a same layer as the active pattern 214 of the driving transistor DT and the active pattern 224 of the first switching transistor T1. The second electrode 243 of the second switching transistor T2 and the first electrode 212 of the driving transistor DT are connected and formed as an integral structure.

As shown in FIG. 6, the gate 241 of the second switching transistor T2 is served by a gate line G, and the gate line G and the gate 211 of the driving transistor DT are disposed in a same layer.

For example, the second switching transistor T2 is a bottom-gate transistor and a double-gate transistor.

For example, materials of the active pattern 244 of the second switching transistor T2, the active pattern 214 of the driving transistor DT, and the active pattern 224 of the first switching transistor T1 are all P—Si.

For example, a portion of the gate line G that overlaps with an orthographic projection of the active pattern 244 of the second switching transistor T2 on the base 10 serves as the gate 241 of the second switching transistor T2, The second switching transistor T2 is turned on or off under the control of the gate line G.

In a case where the first electrode 242 of the second switching transistor T2 is a source and the second electrode 243 of the second switching transistor T2 is a drain, the first electrode 242 of the second switching transistor T2 is served by a portion of the active pattern 244 of the second switching transistor T2 that is located in the third source region, and the second electrode 243 of the second switching transistor T2 is served by a portion of the active pattern 244 of the second switching transistor T2 that is located in the third drain region. In a case where the first electrode 242 of the second switching transistor T2 is a drain and the second electrode 243 of the second switching transistor T2 is a source, the first electrode 242 of the second switching transistor T2 is served by the portion of the active pattern 244 of the second switching transistor T2 that is located in the third drain region, and the second electrode 243 of the second switching transistor T2 is served by the portion of the active pattern 244 of the second switching transistor T2 that is located in the third source region.

Figure 12:
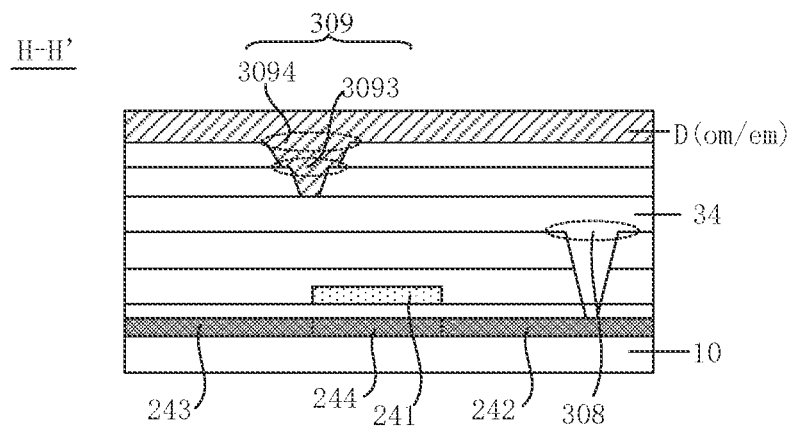
FIG. 12 is schematic sectional view of the driving backplane in FIG. 4 taken along direction H-H'.

As shown in FIGS. 4 and 12, the first electrode 242 of the second switching transistor T2 is electrically connected to the fourth conductive pattern 34 through an eighth via 308, and the fourth conductive pattern 34 is electrically connected to the data line D through a ninth via 309.

The fourth conductive pattern 34 is disposed in a same layer as the first conductive pattern 31 and the second conductive pattern 32.

In some embodiments, as shown in FIG. 12, the ninth via 309 includes a third sub-via 3093 and a fourth sub-via 3094 that are stacked in the thickness direction of the base 10. The fourth sub-via 3094 is located on a side, away from the base 10, of the third sub-via 3093, and is communicated with the third sub-via 3093. A size of the fourth sub-via 3094 is larger than a size of the third sub-via 3093.

Since the data line D and the first power supply voltage line VDD are disposed in a same layer, and the fourth conductive pattern 34 and the second conductive pattern 32 are disposed in a same layer, there are also two insulating layers between the fourth conductive pattern 34 and the data line D. In the two insulating layers, an insulating layer proximate to the base 10 is an inorganic insulating layer, and an insulating layer away from the base 10 is an organic insulating layer. Therefore, the third sub-via 3093 is disposed in the inorganic insulating layer, and the fourth sub-via 3094 is disposed in the organic insulating layer.

It can be seen from this that, the first electrode 242 of the second switching transistor T2 is electrically connected to the data line D through the fourth conductive pattern 34.

In some embodiments, as shown in FIG. 4, the pixel driving circuit further includes a third switching transistor T3.

In some embodiments, an active pattern of the third switching transistor T3 includes a fourth channel region, and a fourth source region and a fourth drain region located on both sides of the fourth channel region. An orthographic projection of a gate 251 of the third switching transistor T3 on the base 10 overlaps with an orthographic projection of the fourth channel region on the base 10. A first electrode 252 and a second electrode 253 of the third switching transistor T3 are respectively served by portions of the active pattern 254 of the third switching transistor T3 that are located in the fourth source region and the fourth drain region.

The first electrode 252 of the third switching transistor T3 and the second electrode 213 of the driving transistor DT are connected and formed as an integral structure, and the second electrode 253 of the third switching transistor T3 and the second electrode 223 of the first switching transistor T1 are connected and formed as an integral structure.

As shown in FIG. 7, the gate 251 of the third switching transistor T3 is served by the gate line G.

For example, the third switching transistor T3 is a bottom-gate transistor.

For example, a portion of the gate line G that overlaps with an orthographic projection of the active pattern 254 of the third switching transistor T3 on the base 10 serves as the gate 251 of the third switching transistor T3. The third switching transistor T3 is turned on or off under the control of the gate line G.

In a case where the first electrode 252 of the third switching transistor T3 is a source and the second electrode 253 of the third switching transistor T3 is a drain, the first electrode 252 of the third switching transistor T3 is served by a portion of the active pattern 254 of the third switching transistor T3 that is located in the fourth source region, and the second electrode 253 of the third switching transistor T3 is served by a portion of the active pattern 254 of the third switching transistor T3 that is located in the fourth drain region. In a case where the first electrode 252 of the third switching transistor T3 is a drain and the second electrode 253 of the third switching transistor is a source, the first electrode 252 of the third switching transistor T3 is served by the portion of the active pattern 254 of the third switching transistor T3 that is located in the fourth drain region, and the second electrode 253 of the third switching transistor T3 is served by the portion of the active pattern 254 of the third switching transistor T3 that is located in the fourth source region.

In this case, the first electrode 252 and the second electrode 253 of the third switching transistor T3 are disposed in a same layer and made of a same material as the active pattern 254 of the third switching transistor T3. Moreover, the first electrode 252 of the third switching transistor T3 and the second electrode 213 of the driving transistor DT are disposed in a same layer, made of a same material, and electrically connected to each other. The second electrode 253 of the third switching transistor T3 and the second electrode 223 of the first switching transistor T1 are disposed in a same layer, made of a same material, and electrically connected to each other.

In some embodiments, as shown in FIG. 4, the pixel driving circuit further includes a fourth switching transistor T4.

An active pattern of the fourth switching transistor T4 includes a fifth channel region, and a fifth source region and a fifth drain region located on both sides of the fifth channel region. An orthographic projection of a gate 261 of the fourth switching transistor T4 on the base 10 overlaps with an orthographic projection of the fifth channel region on the base 10. A first electrode 262 and a second electrode 263 of the fourth switching transistor T4 are served by portions of the active pattern 264 of the fourth switching transistor T4 that are located in the fifth source region and the fifth drain region.

As shown in FIGS. 4 and 8, the first electrode 262 of the fourth switching transistor T4 is electrically connected to the second conductive pattern 32 through an eleventh via 311. The second electrode 263 of the fourth switching transistor T4 and the first electrode 212 of the driving transistor DT are connected and formed as an integral structure.

As shown in FIG. 6, the gate 261 of the fourth switching transistor T4 is served by a light-emitting control line E, and the light-emitting control line E is disposed in a same layer as the gate 211 of the driving transistor DT.

For example, the fourth switching transistor T4 is a bottom-gate transistor.

Since a portion of the light-emitting control line E that overlaps with an orthographic projection of the active pattern 264 of the fourth switching transistor T4 on the base 10 serves as the gate 261 of the fourth switching transistor T4, the fourth switching transistor T4 is turned on or off under the control of the light-emitting control line E.

In a case where the first electrode 262 of the fourth switching transistor T4 is a source and the second electrode 263 of the fourth switching transistor T4 is a drain, the first electrode 262 of the fourth switching transistor T4 is served by a portion of the active pattern 264 of the fourth switching transistor T4 that is located in the fifth source region, and the second electrode 263 of the fourth switching transistor T4 is served by a portion of the active pattern 264 of the fourth switching transistor T4 that is located in the fifth drain region. In a case where the first electrode 262 of the fourth switching transistor T4 is a drain and the second electrode 263 of the fourth switching transistor T4 is a source, the first electrode 262 of the fourth switching transistor T4 is served by the portion of the active pattern 264 of the fourth switching transistor T4 that is located in the fifth drain region, and the second electrode 263 of the fourth switching transistor T4 is served by the portion of the active pattern 264 of the fourth switching transistor T4 that is located in the fifth source region.

The first electrode 262 and the second electrode 263 of the fourth switching transistor T4 and the active pattern 264 of the fourth switching transistor T4 are disposed in a same layer, made of a same material, and electrically connected to each other. The second electrode 263 of the fourth switching transistor T4 and the first electrode 212 of the driving transistor DT are disposed in a same layer, made of a same material, and electrically connected to each other.

Since the first electrode 262 of the fourth switching transistor T4 is electrically connected to the second conductive pattern 32 through the eleventh via 311, and the second conductive pattern 32 is electrically connected to the second storage electrode 232 of the capacitor C and the first power supply voltage line VDD (that is, the first power supply voltage line VOD is electrically connected to the second storage electrode 232 of the capacitor C and the first electrode 262 of the fourth switching transistor T4 through the second conductive pattern 32), a signal from the first power supply voltage line VOD may be transmitted to the second storage electrode 232 of the capacitor C and the first electrode 262 of the fourth switching transistor T4.

Figure 13:
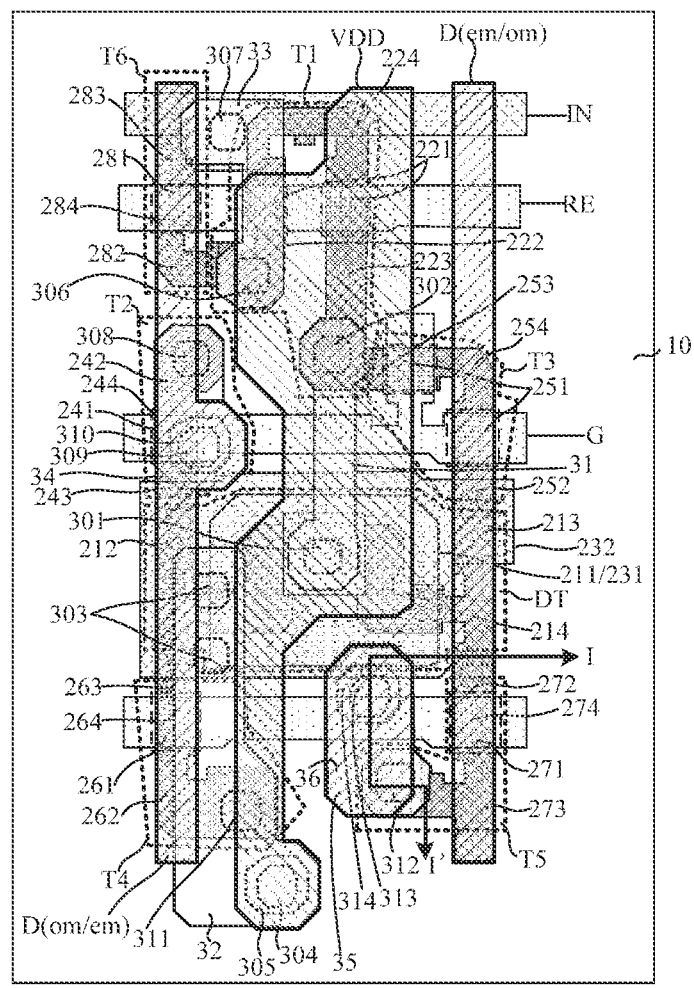
FIG. 13 is a schematic diagram showing a structure of yet another driving backplane, in accordance with some embodiments.

In some embodiments, as shown in FIG. 13, the pixel driving circuit further includes a fifth switching transistor T5, a fifth conductive pattern 35, and a sixth conductive pattern 36.

As shown in FIG. 6, a gate 271 of the fifth switching transistor T5 is served by the light-emitting control line E. An active pattern of the fifth switching transistor T5 includes a sixth channel region, and a sixth source region and a sixth drain region located on both sides of the sixth channel region. An orthographic projection of the gate 271 of the fifth switching transistor T5 on the base 10 overlaps with an orthographic projection of the sixth channel region on the base 10. A first electrode 272 and a second electrode 273 of the fifth switching transistor T5 are served by portions of the active pattern 274 of the fifth switching transistor T5 that are located in the sixth source region and the sixth drain region. In addition, the first electrode 272 of the fifth switching transistor T5 and the second electrode 213 of the driving transistor DT are connected and formed as an integral structure.

Figure 14:
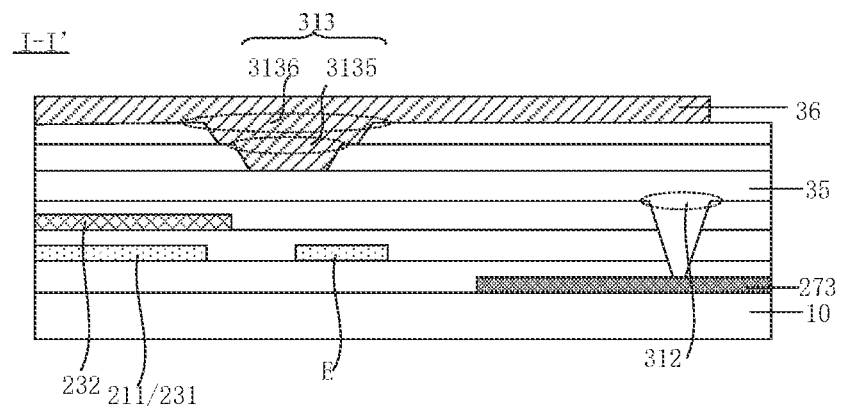
FIG. 14 is schematic sectional view of the driving backplane in FIG. 13 taken along direction I-I'.

As shown in FIGS. 13 and 14, the second electrode 273 of the fifth switching transistor T5 is electrically connected to the fifth conductive pattern 35 through a twelfth via 312. The fifth conductive pattern 35 is electrically connected to the sixth conductive pattern 36 through a thirteenth via 313. The sixth conductive pattern 36 is configured to be electrically connected to a light-emitting device L.

Figure 16:
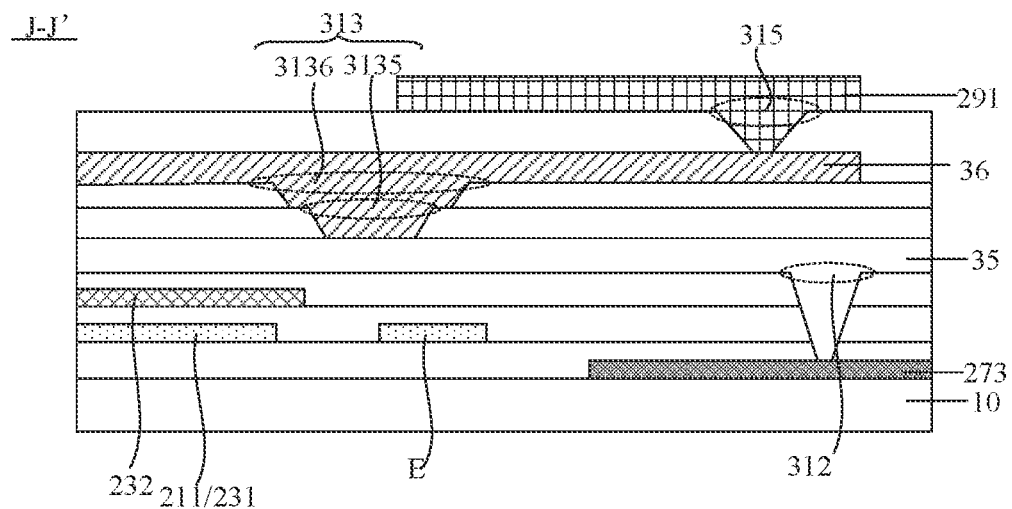
FIG. 16 is schematic sectional view of the driving backplane in FIG. 15 taken along direction J-J'.

In some embodiments, as shown in FIG. 16, the thirteenth via 313 includes a fifth sub-via 3135 and a sixth sub-via 3136 that are stacked in the thickness direction of the base 10. The sixth sub-via 3136 is located on a side, away from the base 10, of the fifth sub-via 3135, and is communicated with the fifth sub-via 3135. A size of the sixth sub-via 3136 is larger than a size of the fifth sub-via 3135.

Since a portion of the light-emitting control line E that overlaps with an orthographic projection of the active pattern 274 of the fifth switching transistor T5 on the base 10 serves as the gate 271 of the fifth switching transistor T5, the fifth switching transistor T5 is turned on or off under the control of the light-emitting control line E.

In a case where the first electrode 272 of the fifth switching transistor T5 is a source and the second electrode 273 of the fifth switching transistor T5 is a drain, the first electrode 272 of the fifth switching transistor T5 is served by a portion of the active pattern 274 of the fifth switching transistor T5 that is located in the sixth source region, and the second electrode 273 of the fifth switching transistor T5 is served by a portion of the active pattern 274 of the fifth switching transistor T5 that is located in the sixth drain region. In a case where the first electrode 272 of the fifth switching transistor T5 is a drain and the second electrode 273 of the fifth switching transistor T5 is a source, the first electrode 272 of the fifth switching transistor T5 is served by the portion of the active pattern 274 of the fifth switching transistor T5 that is located in the sixth drain region, and the second electrode 273 of the fifth switching transistor T5 is served by the portion of the active pattern 274 of the fifth switching transistor T5 that is located in the sixth source region.

The first electrode 272 and the second electrode 273 of the fifth switching transistor T5 and the active pattern 274 of the fifth switching transistor T5 are disposed in a same layer, made of a same material, and electrically connected to each other. In addition, the first electrode 272 of the fifth switching transistor T5 and the second electrode 213 of the driving transistor DT are disposed in a same layer, made of a same material, and electrically connected to each other.

For example, the fifth switching transistor T5 is a bottom-gate transistor.

The fifth conductive pattern 35 and the second conductive pattern 32 are disposed in a same layer, and the sixth conductive pattern 36 is disposed in a same layer as the data line D and the first power voltage line VDD.

Since the second electrode 273 of the fifth switching transistor T5 is electrically connected to the fifth conductive pattern 35, and the fifth conductive pattern 35 is electrically connected to the sixth conductive pattern 36, in a case where the sixth conductive pattern 36 is electrically connected to the light-emitting device L, the second electrode 273 of the fifth switching transistor T5 is electrically connected to the light-emitting device L through the fifth conductive pattern 35 and the sixth conductive pattern 36.

There are also two insulating layers between the fifth conductive pattern 35 and the sixth conductive pattern 36. In the two insulating layers, an insulating layer proximate to the base 10 is an inorganic insulating layer, and an insulating layer away from the base 10 is an organic insulating layer. Therefore, the fifth sub-via 3135 passes through the inorganic insulating layer, and the sixth sub-via 3136 passes through the organic insulating layer.

Figure 15:
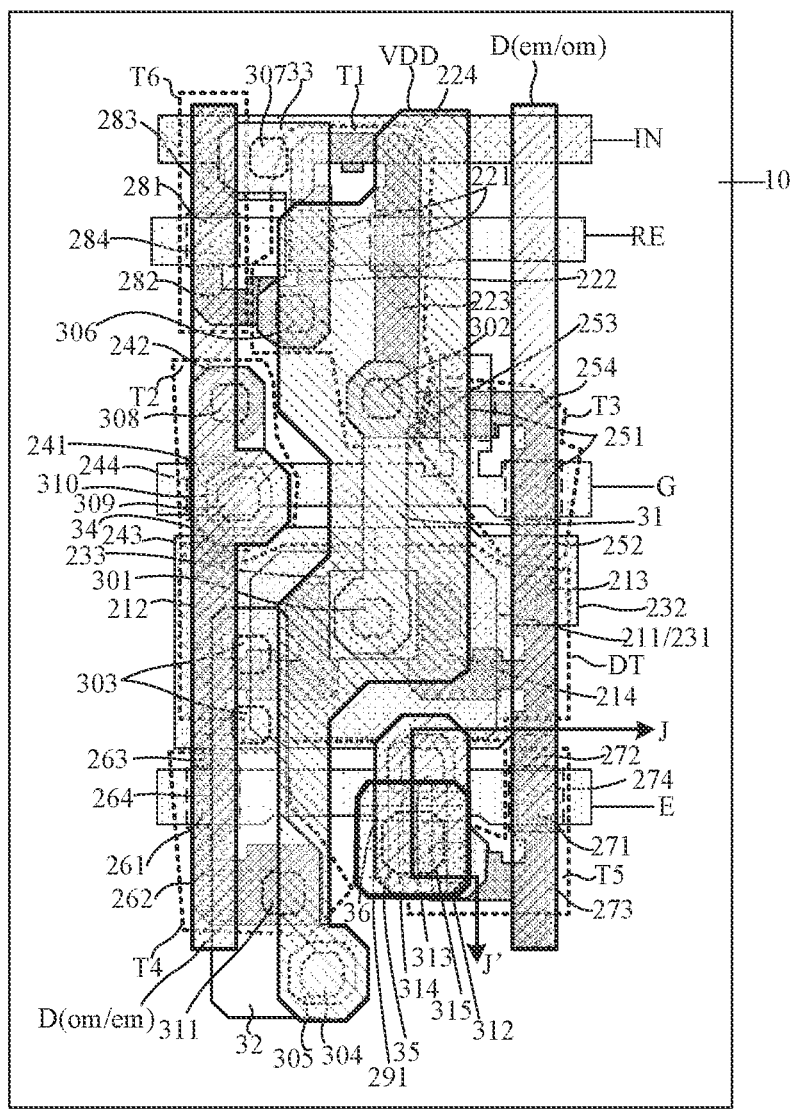
FIG. 15 is a schematic diagram showing a structure of yet another driving backplane, in accordance with some embodiments.

As shown in FIGS. 15 and 16, the sixth conductive pattern 36 may be electrically connected to a first electrode 291 of the light-emitting device L through a fifteenth via 315, and the first electrode 291 of the light-emitting device L is located on a side, away from the base 10, of the sixth conductive pattern 36. Therefore, there is an insulating layer between the light-emitting device L and the sixth conductive pattern 36, and the fifteenth via 315 passes through the insulating layer.

Optionally, the first electrode 291 of the light-emitting device L is an anode.

In some embodiments, as shown in FIG. 4, the pixel driving circuit further includes a sixth switching transistor T6.

An active pattern of the sixth switching transistor T6 includes a seventh channel region, and a seventh source region and a seventh drain region located on both sides of the seventh channel region. An orthographic projection of a gate of the sixth switching transistor T6 on the base 10 overlaps with an orthographic projection of the seventh channel region on the base, and a first electrode 282 and a second electrode 283 of the sixth switching transistor T6 are served by portions of the active pattern 284 of the sixth switching transistor T6 that located in the seventh source region and the seventh drain region. The first electrode 282 of the sixth switching transistor T6 and the first electrode 222 of the first switching transistor T1 are connected and formed as an integral structure.

For example, the sixth switching transistor T6 is a bottom-gate transistor.

As shown in FIG. 6, the gate 281 of the sixth switching transistor T6 is served by the reset signal line RE. For example, a portion of the reset signal line RE that overlaps with an orthographic projection of the active pattern 284 of the sixth switching transistor T6 on the base 10 serves as the gate 281 of the sixth switching transistor T6.

The sixth switching transistor T6 is turned on or off under the control of the reset signal line RE.

In a case where the first electrode 282 of the sixth switching transistor T6 is a source and the second electrode 283 of the sixth switching transistor T6 is a drain, the first electrode 282 of the sixth switching transistor T6 is served by a portion of the active pattern 284 of the sixth switching transistor T6 that is located in the seventh source region, and the second electrode 283 of the sixth switching transistor T6 is served by a portion of the active pattern 284 of the sixth switching transistor T6 that is located in the seventh drain region. In a case where the first electrode 282 of the sixth switching transistor T6 is a drain and the second electrode 283 of the sixth switching transistor T6 is a source, the first electrode 282 of the sixth switching transistor T6 is served by the portion of the active pattern 284 of the sixth switching transistor T6 that is located in the seventh drain region, and the second electrode 283 of the sixth switching transistor T6 is served by the portion of the active pattern 284 of the sixth switching transistor T6 that is located in the seventh source region.

The first electrode 282 and the second electrode 283 of the sixth switching transistor T6 are disposed in a same layer and made of a same material as the active pattern 284 of the sixth switching transistor T6. In addition, the first electrode 282 of the sixth switching transistor T6 and the first electrode 222 of the first switching transistor T1 are disposed in a same layer and made of a same material.

Figure 17:
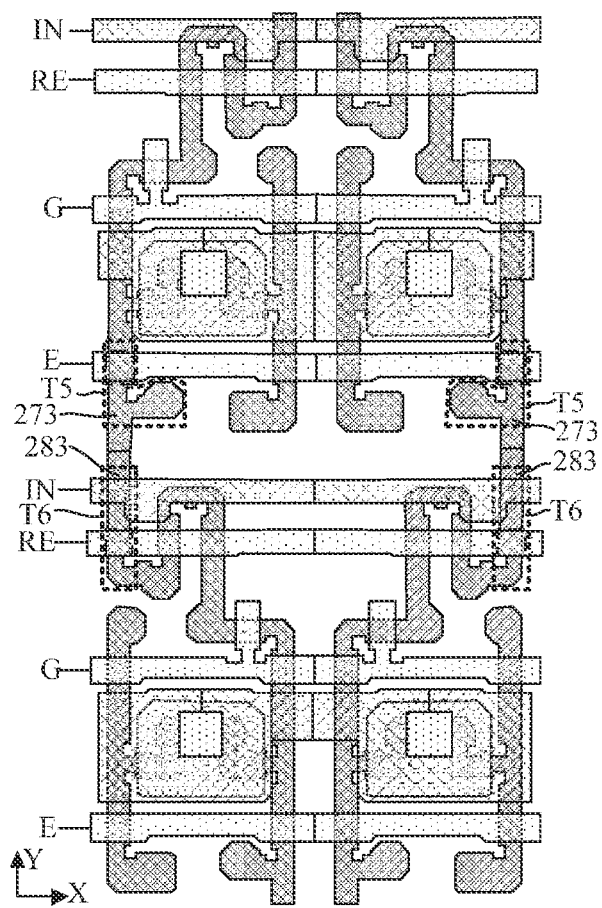
FIG. 17 is a schematic diagram showing a structure of yet another driving backplane, in accordance with some embodiments.

In the embodiments of the present disclosure, as shown in FIG. 17, sub-pixel regions in a same column of the plurality of sub-pixel regions, except for sub-pixel regions in a first row, second electrodes 283 of sixth switching transistors T6 in pixel driving circuits of sub-pixel regions in each row and second electrodes 273 of fifth switching transistors T5 in pixel driving circuits of sub-pixel regions in a previous row are connected and formed as integral structures.

In addition, except for sub-pixel regions in the first row, the second electrodes 283 of the sixth switching transistors T6 in the pixel driving circuits of sub-pixel regions in each row are disposed in a same layer and made of a same material as the second electrodes 273 of the fifth switching transistors T5 in the pixel driving circuits of sub-pixel regions in the previous row.

For example, in addition to the sub-pixel regions in the first row, second electrodes 283 of sixth switching transistors T6 in pixel driving circuits of sub-pixel regions in a j-th row and second electrodes 273 of fifth switching transistors T5 in pixel driving circuits of sub-pixel regions in a (j−1)-th row are connected and formed as integrated structures. Herein, j is a positive integer greater than 1 and less than or equal to n.

Since the second electrode 273 of the fifth switching transistor T5 is electrically connected to the light-emitting device L, a second electrode 283 of a sixth switching transistor T6 that is connected to the second electrode 273 of the fifth switching transistor T5 is also electrically connected to the light-emitting device L. Moreover, since the first electrode 282 of the sixth switching transistor T6 is connected to the first electrode 222 of the first switching transistor T1, and the first electrode 222 of the first switching transistor T1 is electrically connected to the initialization signal line IN (that is, the first electrode 282 of the sixth switching transistor T6 is electrically connected to the initialization signal line IN), when the sixth switching transistor T6 is turned on under the control of the reset signal line RE, the initialization signal line IN may be electrically connected to the light-emitting device L to initialize the light-emitting device L.

Further, in some embodiments, except for the sub-pixel regions in the first row, a reset signal line RE electrically connected to the pixel driving circuits of sub-pixel regions in each row is shared with a gate line G electrically connected to the pixel driving circuits of sub-pixel regions in the previous row.

Therefore, except for the sub-pixels regions in the first row, the pixel driving circuits of sub-pixel regions in each row are also electrically connected to a gate line that is electrically connected to the pixel driving circuits of sub-pixel regions in the previous row. For example, as shown in FIG. 1, a gate line G(1) electrically connected to the pixel driving circuits of sub-pixel regions in the first row, as a reset signal line RE electrically connected to pixel driving circuits of sub-pixels regions in a second row, is electrically connected to the pixel driving circuits of sub-pixel regions in the second row; and a gate line G(n−1) electrically connected to pixel driving circuits of sub-pixel regions in an (n−1)-th row, as a reset signal line RE electrically connected to pixel driving circuits of sub-pixels regions in an n-th row, is electrically connected to the pixel driving circuits of sub-pixel regions in the n-th row.

Therefore, except for sub-pixel regions in a last row, when the pixel driving circuits of sub-pixel regions in each row perform data writing, pixel driving circuits of sub-pixel regions in a next row are reset.

It will be noted that, as shown in FIG. 1, pixel driving circuits of sub-pixel regions in the first row are electrically connected to an initial reset signal line REO, the initial reset signal line REO is electrically connected to a scan driver 11, and the pixel driving circuits of sub-pixel regions in the first row are reset under the control of the initial reset signal line REO.

In some embodiments, pixel driving circuits of sub-pixel regions in any adjacent sub-pixel regions in a same row are arranged in mirror symmetry; and pixel driving circuits of sub-pixel regions in any two adjacent columns are also arranged in mirror symmetry.

Further, in some embodiments, in each sub-pixel region, a shape of an overlapping portion of the first power supply voltage line VDD and the pixel driving circuit is irregular.

Referring to FIG. 13, in a region where the pixel driving circuit is located, the orthographic projection of the first power supply voltage line VDD on the base 10 is in a shape of a Chinese character "π". An average width of a portion of the orthographic projection of the first power supply voltage line VDD on the base 10 that overlaps with the first conductive pattern 31, the first switching transistor T1, and the driving transistor DT is greater than an average width of a portion of the orthographic projection of the first power supply voltage line VDD on the base 10 that overlaps with the second conductive pattern 32.

In a case where a shape of the first power supply voltage line VDD is irregular, in sub-pixel regions in a column, first power supply voltage lines VDD of two adjacent pixel driving circuits (upper and lower) can be effectively connected.

Figure 18:
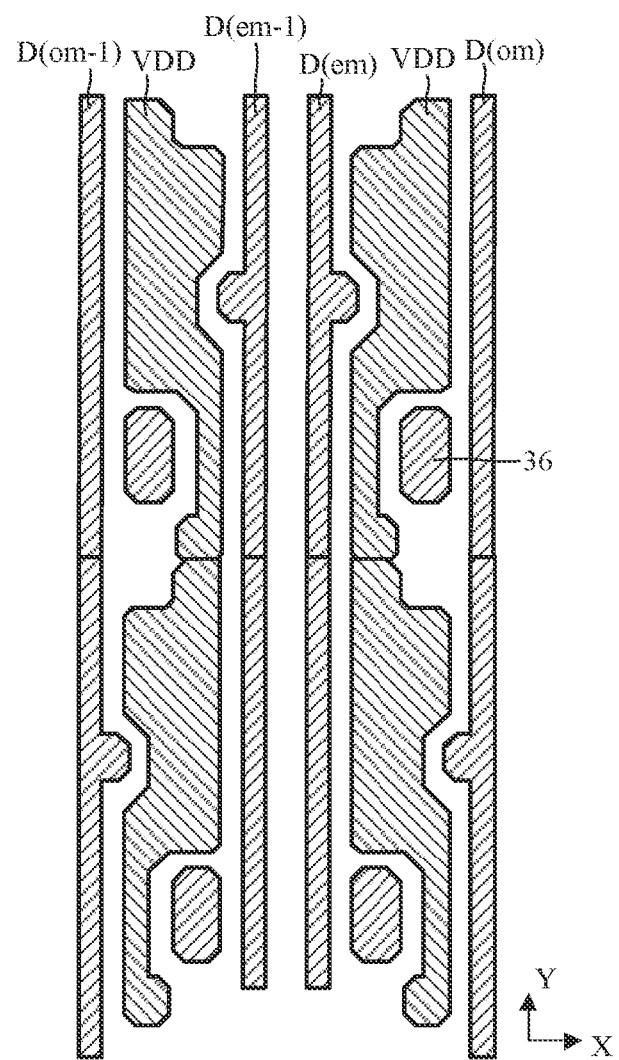
FIG. 18 is a schematic diagram showing a structure of yet another driving backplane, in accordance with some embodiments.

In some embodiments, in a case where the pixel driving circuits of sub-pixel regions in the same column are electrically connected to two data lines, as shown in FIG. 18, a first power supply voltage line VDD electrically connected to the pixel driving circuits of sub-pixel regions in the same column are located between the two data lines. In this case, it may be possible to avoid restrictions on a spatial layout of sub-pixels in the display panel.

Moreover, in the case where the pixel driving circuits of sub-pixel regions in the same column are electrically connected to two data lines, it may be possible to drive the display panel at a high frame rate (for example, 120 Hz) under the premise of ensuring the display effect of the display panel.

In the driving backplane provided in the embodiments of the present disclosure, the base 10 is provided with an active pattern in each transistor in the pixel driving circuit, the gate line G, the gate 211 of the driving transistor DT, the reset signal line RE, and the light-emitting control line E that are disposed in a same layer and made of a same material are provided on a side, away from the base 10, of active patterns that are disposed in a same layer and made of a same material. The initialization signal line IN and the second storage electrode 232 of the capacitor C that are disposed in a same layer and made of a same material are provided on a side, away from the base 10, of the gate line G, the first conductive pattern 31, the second conductive pattern 32, the third conductive pattern 33, the fourth conductive pattern 34, and the fifth conductive pattern 35 that are disposed in a same layer and made of a same material are provided on a side, away from the base 10, of the second storage electrode 232 of the capacitor C. The data line D, the first power supply voltage line VDD and the sixth conductive pattern 36 that are disposed in a same layer and made of a same material are provided on a side, away from the base 10, of the first conductive pattern 31, the first electrode of the light-emitting device L is provided on a side, away from the base, of the sixth conductive pattern 36.

A material of each active pattern may be a semiconductor material. The gate line G, the gate 211 of the driving transistor DT, the reset signal line RE, the light-emitting control line E, the initialization signal line IN, the second electrode 232 of the capacitor C, the first conductive pattern 31, the second conductive pattern 32, the third conductive pattern 33, the fourth conductive pattern 34, the fifth conductive pattern 35, the data line D, the first power supply voltage line VDD, the sixth conductive pattern 36, and the first electrode of the light-emitting device L may all be made of a metal material. In this case, the driving backplane adopts a five-layer metal process to route the pixel driving circuit. In this way, it may be possible to avoid a problem of greater restrictions on the spatial layout of sub-pixels in display panels with a high PPI (Pixels Per Inch; e.g., greater than 500 PPI).

In the embodiments of the present disclosure, as shown in FIG. 2, the display panel further includes a plurality of light-emitting devices L. The light-emitting device L is provided in each of the plurality of sub-pixel regions on the driving backplane, and is electrically connected to the pixel driving circuit. The pixel driving circuit drives the light-emitting device L to operate. The light-emitting device L is also electrically connected to a second power supply voltage line VSS.

For example, the plurality of light-emitting devices L includes a plurality of first color light-emitting devices, a plurality of second color light-emitting devices, and a plurality of third color light-emitting devices. The first color, the second color and the third color are three primary colors (the three primary colors are, for example, red, green and blue).

For example, the light-emitting device L is a micro light-emitting diode (Micro LED), a mini light-emitting diode (Mini LED), or an organic light-emitting diode (OLED).

In some embodiments, as shown in FIG. 1, the display panel further includes a scan driver 11, a light-emitting driver 12, a data driver 13, a timing controller 14 and a plurality of multiplexers 15 disposed in the peripheral region S. Each of the plurality of multiplexers 15 corresponds to the pixel driving circuits of sub-pixel regions in a column of the plurality of sub-pixel regions.

The scan driver 11 is electrically connected to a plurality of gate lines G and the timing controller 40. For example, as shown in FIG. 1, the display panel has n rows of sub-pixel regions. All gate lines, from the gate line G(1) that is electrically connected to the pixel driving circuits of sub-pixel regions in the first row to a gate line G(n) that is electrically connected to the pixel driving circuits of sub-pixel regions in the n-th row, are electrically connected to the scan driver 11.

The light-emitting driver 12 is electrically connected to the light-emitting control lines E and the timing controller 14. For example, as shown in FIG. 1, the display panel has n rows of sub-pixel regions. All light-emitting control lines, from a light-emitting control line E(1) that is electrically connected to the pixel driving circuits of sub-pixel regions in the first row to a light-emitting control line E(n) that is electrically connected to the pixel driving circuits of sub-pixel regions in the n-th row, are electrically connected to the light-emitting driver 12.

The data driver 13 is electrically connected to the multiplexers 15 and the timing controller 14.

For example, as shown in FIG. 1, the display panel has m columns of sub-pixel regions, and correspondingly, the number of the multiplexers 15 is m. Each multiplexer 15 is electrically connected to the data driver 13 through a data cable, and the number of the data cables is m. Specifically, a multiplexer 15 corresponding to sub-pixel regions in a first column is electrically connected to the data driver 13 through a data cable D(1); a multiplexer 15 corresponding to sub-pixel regions in a second column is electrically connected to the data driver 13 through a data cable D(2): and a multiplexer 15 corresponding to sub-pixel regions in a m-th column is electrically connected to the data driver 13 through a data cable D(m).

Each of the plurality of multiplexers 15 is also electrically connected to the timing controller 14 and two data lines that are electrically connected to pixel driving circuits of sub-pixel regions in a same column corresponding to each of the plurality of multiplexers 15.

In some embodiments, the pixel driving circuits of the sub-pixel regions in the same column are electrically connected to two data lines. Wherein, one of the two data lines is electrically connected to pixel driving circuits of sub-pixel regions in odd rows, and the other of the two data lines is electrically connected to pixel driving circuits of sub-pixel regions in even rows.

For example, in sub-pixel regions in a column, the pixel driving circuits of sub-pixel regions in the odd rows are electrically connected to a multiplexer 15 corresponding to the sub-pixel regions in this column through a data line, and the pixel driving circuits of sub-pixel regions in the even rows are electrically connected to the multiplexer 15 corresponding to the sub-pixel regions in this column through the other data line.

For example, as shown in FIG. 1, in sub-pixel regions in the first column, the pixel driving circuits of sub-pixel regions in the odd rows are electrically connected to the multiplexer 15 corresponding to the sub-pixel regions in the first column through a data line D(o1), and the pixel driving circuits of sub-pixel regions in the even rows are electrically connected to the multiplexer 15 corresponding to the sub-pixel regions in the first column through a data line D(e1); in sub-pixel regions in the second column, the pixel driving circuits of sub-pixel regions in the odd rows are electrically connected to a multiplexer 15 corresponding to the sub-pixel regions in the second column through a data line D(o2), and the pixel driving circuits of sub-pixel regions in the even rows are electrically connected to the multiplexer 15 corresponding to the sub-pixel regions in the second column through a data line D(e2); . . . ; and in the sub-pixel regions in the m-th column, the pixel driving circuits of sub-pixel regions in the odd rows are electrically connected to the multiplexer 15 corresponding to the sub-pixel regions in the m-th column through a data line D(om), and the pixel driving circuits of sub-pixel regions in the even rows are electrically connected to the multiplexer 15 corresponding to the sub-pixel regions in the m-th column through a data line D(em).

The scan driver 11 is configured to output gate scan signals to the plurality of gate lines G one by one in response to a signal received from the timing controller 14.

For example, the display panel has n rows of sub-pixel regions, and the scan driver 11 sequentially outputs gate scan signals one by one from the first gate line G(1) to the n-th gate line G(n) in response to the signal received from the timing controller 14.

The light-emitting driver 12 is configured to output light-emitting control signals to the light-emitting control lines E one by one in response to the signal received from the timing controller 14.

For example, the display panel has n rows of sub-pixel regions, and the light-emitting driver 12 sequentially outputs light-emitting control signals one by one from the first light-emitting control line E(1) to the n-th light-emitting control line E(n) in response to the signal received from the timing controller 14.

The data driver 13 is configured to output data signals to the plurality of multiplexers 15 in response to the signal received from the timing controller 14.

Each of the plurality of multiplexers 15 is configured to transmit a data signal from the data driver 13 to one of the two data lines and the other of the two data lines in different time periods in response to the signal received from the timing controller 14.

For example, as for sub-pixel regions in the m-th column, if data is to be written into sub-pixel regions in the odd rows, the multiplexer 15 transmits the data signal from the data driver 13 to the data line D(om) in response to the signal received from the timing controller 14, so that the data is written into the sub-pixel regions in the odd rows that are electrically connected to the data line D(om); and if data is to be written into the sub-pixel regions in the even rows, the multiplexer 15 transmits the data signal from the data driver 13 to another data line D(em) in response to the signal received from the timing controller 14, so that the data is written into the sub-pixel regions in the even rows that are electrically connected to the data line D(em).

In some embodiments of the present disclosure, as shown in FIG. 1, each multiplexer 15 includes a first transistor M1 and a second transistor M2. A gate of the first transistor M1 is electrically connected to the timing controller 14, a first electrode of the first transistor M1 is electrically connected to the multiplexer 15, and a second electrode of the first transistor M1 is electrically connected to one of the two data lines; a gate of the second transistor M2 is electrically connected to the timing controller 14, a first electrode of the second transistor M2 is electrically connected to the multiplexer 15, and a second electrode of the second transistor M2 is electrically connected to another of the two data lines.

For example, as for sub-pixel regions in the m-th column, the second electrode of the first transistor M1 is electrically connected to the data line D(om), and the data line D(om) is electrically connected to sub-pixel regions in the odd rows of sub-pixel regions in the m-th column; the second electrode of the second transistor M2 is electrically connected to the data line D(em), and the data line D(em) is electrically connected to sub-pixel regions in the even rows of sub-pixel regions in the m-th column. If data is to be written into sub-pixel regions in the odd rows, under the control of the timing controller 14, the first transistor M1 is turned on, the second transistor M2 is turned off, and the data signal from the data driver 13 is transmitted into the data line D(om) through the first transistor M1, so that the data is written into sub-pixel regions in the odd rows; and if data is to be written into sub-pixel regions in the even rows, under the control of the timing controller 14, the second transistor M2 is turned on, the first transistor M1 is turned off, and the data signal from the data driver 13 is transmitted into the other data line D(em) through the second transistor M2, so that the data is written into sub-pixels regions in the even rows of sub-pixel regions in the m-th column.

The embodiments of the present disclosure are not limited thereto, and those skilled in the art can set the number of the scan drivers 11, the light-emitting drivers 12, the data drivers 13, and the timing controllers 14 according to a resolution of the display panel. For example, two scan drivers 11 are provided on both sides of the peripheral region S, and the two scan drivers 11 are positioned opposite to each other. The two scan drivers 11 are both electrically connected to each gate line G, and work synchronously. Correspondingly, two light-emitting drivers 12 are provided on both sides of the peripheral region 3, and the two light-emitting drivers 12 are positioned opposite to each other. The two light-emitting drivers 12 are both electrically connected to each light-emitting control line E, and work synchronously. Further, two timing controllers 14 are provided, one timing controller 14 is electrically connected to a scan driver 11 and a light-emitting driver 12 that are located on one side of the peripheral region S, and the other timing controller 14 is electrically connected to a scan driver 11 and a light-emitting driver 12 that are located on the other side of the peripheral region S. The two timing controllers 14 are electrically connected and work synchronously. Further, the multiplexer 15 may also be electrically connected to the two timing controllers 14.

The foregoing descriptions are merely specific implementations of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A driving backplane having a plurality of sub-pixel regions, the driving backplane comprising:
a base;
a plurality of pixel driving circuits disposed on the base, one of the plurality of pixel driving circuits being disposed in one of the plurality of sub-pixel regions; and
a plurality of data lines and a plurality of first power supply voltage lines disposed on the base; wherein
the pixel driving circuit is electrically connected to a data line and a first power supply voltage line; the data line and the first power supply voltage line are disposed on a side, away from the base, of the pixel driving circuit, and the data line and the first power supply voltage line are disposed at intervals in a same layer; and an orthographic projection of the data line on the base overlaps with an orthographic projection of the pixel driving circuit on the base; wherein
the pixel driving circuit comprises:
a driving transistor;
a first switching transistor; and
a first conductive pattern, the first conductive pattern being located on a side, away from the base, of the driving transistor and the first switching transistor; wherein
the first conductive pattern is electrically connected to a gate of the driving transistor through a first via, and the first conductive pattern is electrically connected to a second electrode of the first switching transistor through a second via; and
an orthographic projection of the first conductive pattern on the base is located within an orthographic projection of the first power supply voltage line on the base;
wherein the pixel driving circuit further comprises a capacitor and a second conductive pattern; wherein
the gate of the driving transistor is multiplexed as a first storage electrode of the capacitor; and a second storage electrode of the capacitor is located on a side, away from the base, of the first storage electrode; and
the second conductive pattern is electrically connected to the second storage electrode through at least one third via, and the second conductive pattern is electrically connected to the first power supply voltage line through a fourth via;
the second conductive pattern and the first conductive pattern are disposed in a same layer, and the first power supply voltage line is disposed on a side, away from the second storage electrode, of a layer where the second conductive pattern and the first conductive pattern are located; and
the second storage electrode is provided with a hollow region, and the first via is directly opposite to the hollow region;
wherein the fourth via comprises a first sub-via and a second sub-via that are stacked in a thickness direction of the base; the second sub-via is located on a side, away from the base, of the first sub-via, and is communicated with the first sub-via; and a size of the second sub-via is greater than a size of the first sub-via; and the second sub-via is disposed in an organic insulating layer, and the first sub-via is disposed in an inorganic insulating layer.

2. The driving backplane according to claim 1, wherein an active pattern of the first switching transistor comprises at least one first channel region, and a first source region and a first drain region located on both sides of the at least one first channel region; a gate of the first switching transistor is disposed on a side, away from the base, of a corresponding first channel region, and an orthographic projection of the at least one first channel region on the base overlaps with an orthographic projection of the gate of the first switching transistor on the base; and a first electrode and a second electrode of the first switching transistor are served by portions of the active pattern of the first switching transistor that are located in the first source region and the first drain region; and an orthographic projection of the second electrode of the first switching transistor on the base is located within the orthographic projection of the first power supply voltage line on the base.

3. The driving backplane according to claim 2, wherein an active pattern of the driving transistor comprises a second channel region, and a second source region and a second drain region located on both sides of the second channel region; an orthographic projection of the second channel region on the base overlaps with an orthographic projection of the gate of the driving transistor on the base; and a first electrode and a second electrode of the driving transistor are served by portions of the active pattern of the driving transistor that are located in the second source region and the second drain region; and the active pattern of the driving transistor and the active pattern of the first switching transistor are disposed in a same layer.

4. The driving backplane according to claim 1, wherein in sub-pixel regions in a same row in the plurality of sub-pixel regions, second storage electrodes of capacitors in pixel driving circuits of any adjacent sub-pixel regions are electrically connected to each other.

5. The driving backplane according to claim 1, wherein the pixel driving circuit further includes a third conductive pattern; wherein the first electrode of the first switching transistor is electrically connected to the third conductive pattern through a sixth via, the third conductive pattern is electrically connected to an initialization signal line through a seventh via, and the initialization signal line and the second storage electrode are disposed in a same layer; and the third conductive pattern and the second conductive pattern are disposed in a same layer.

6. The driving backplane according to claim 5, wherein the pixel driving circuit further comprises a second switching transistor and a fourth conductive pattern; wherein a gate of the second switching transistor is served by a gate line, and the gate line and the gate of the driving transistor are disposed in a same layer;

an active pattern of the second switching transistor comprises a third channel region, and a third source region and a third drain region located on both sides of the third channel region; an orthographic projection of the gate of the second switching transistor on the base overlaps with an orthographic projection of the third channel region on the base, and a first electrode and a second electrode of the second switching transistor are served by portions of the active pattern of the second switching transistor that are located in the third source region and the third drain region;

the first electrode of the second switching transistor is electrically connected to the fourth conductive pattern through an eighth via, and the fourth conductive pattern is electrically connected to the data line through a ninth via;

the second electrode of the second switching transistor and the first electrode of the driving transistor are connected and formed as an integral structure; and the fourth conductive pattern is disposed in a same layer as the first conductive pattern and the second conductive pattern.

7. The driving backplane according to claim 6, wherein the ninth via comprises a third sub-via and a fourth sub-via that are stacked in a thickness direction of the base; the fourth sub-via is located on a side, away from the base, of the third sub-via, and is communicated with the third sub-via; and a size of the fourth sub-via is greater than a size of the third sub-via; and the fourth sub-via is disposed in an organic insulating layer, and the third sub-via is disposed in an inorganic insulating layer.

8. The driving backplane according to claim 6, wherein the pixel driving circuit further comprises a third switching transistor; wherein a gate of the third switching transistor is served by the gate line;

an active pattern of the third switching transistor comprises a fourth channel region, and a fourth source region and a fourth drain region located on both sides of the fourth channel region; an orthographic projection of the gate of the third switching transistor on the base overlaps with an orthographic projection of the fourth channel region on the base, and a first electrode and a second electrode of the third switching transistor are served by portions of the active pattern of the third switching transistor that are located in the fourth source region and the fourth drain region;

the first electrode of the third switching transistor and the second electrode of the driving transistor are connected and formed as an integral structure; and the second electrode of the third switching transistor and the second electrode of the first switching transistor are connected and formed as an integral structure.

9. The driving backplane according to claim 8, wherein the pixel driving circuit further comprises a fourth switching transistor; wherein a gate of the fourth switching transistor is served by a light-emitting control line, and the light-emitting control line is disposed in a same layer as the gate of the driving transistor;

an active pattern of the fourth switching transistor comprises a fifth channel region, and a fifth source region and a fifth drain region located on both sides of the fifth channel region; an orthographic projection of the gate of the fourth switching transistor on the base overlaps with an orthographic projection of the fifth channel region on the base, and a first electrode and a second electrode of the fourth switching transistor are served by portions of the active pattern of the fourth switching transistor that are located in the fifth source region and the fifth drain region;

the first electrode of the fourth switching transistor is electrically connected to the second conductive pattern through an eleventh via; and the second electrode of the fourth switching transistor and the first electrode of the driving transistor are connected and formed as an integral structure.

10. The driving backplane according to claim 9, wherein the pixel driving circuit further comprises a fifth switching transistor, a fifth conductive pattern, and a sixth conductive pattern; wherein a gate of the fifth switching transistor is served by the light-emitting control line;

an active pattern of the fifth switching transistor comprises a sixth channel region, and a sixth source region and a sixth drain region located on both sides of the sixth channel region; an orthographic projection of the gate of the fifth switching transistor on the base overlaps with an orthographic projection of the sixth channel region on the base, and a first electrode and a second electrode of the fifth switching transistor are served by portions of the active pattern of the fifth switching transistor that are located in the sixth source region and the sixth drain region;

the first electrode of the fifth switching transistor and the second electrode of the driving transistor are connected and formed as an integral structure;

the second electrode of the fifth switching transistor is electrically connected to the fifth conductive pattern through a twelfth via, and the fifth conductive pattern is electrically connected to the sixth conductive pattern through a thirteenth via; and the sixth conductive pattern is configured to be electrically connected to a light-emitting device;

the fifth conductive pattern and the second conductive pattern are disposed in a same layer; and the sixth conductive pattern is disposed in a same layer as the data line and the first power supply voltage line.

11. The driving backplane according to claim 10, wherein the pixel driving circuit further comprises a sixth switching transistor; wherein a gate of the sixth switching transistor is served by a reset signal line;

an active pattern of the sixth switching transistor comprises a seventh channel region, and a seventh source region and a seventh drain region located on both sides of the seventh channel region; an orthographic projection of the gate of the sixth switching transistor on the base overlaps with an orthographic projection of the seventh channel region on the base, and a first electrode and a second electrode of the sixth switching transistor are served by portions of the active pattern of the sixth switching transistor that are located in the seventh source region and the seventh drain region;

the first electrode of the sixth switching transistor and the first electrode of the first switching transistor are connected and formed as an integral structure; and in sub-pixel regions in a same column in the plurality of sub-pixel regions, except for sub-pixel regions in a first row, second electrodes of sixth switching transistors in pixel driving circuits of sub-pixel regions in each row and second electrodes of fifth switching transistors in pixel driving circuits of sub-pixel regions in a previous row are connected and formed as integral structures.

12. The driving backplane according to claim 11, wherein except for the sub-pixel regions in the first row, a reset signal line electrically connected to the pixel driving circuits of the sub-pixel regions in each row is shared with a gate line electrically connected to the pixel driving circuits of sub-pixel regions in the previous row.

13. The driving backplane according to claim 1, wherein pixel driving circuits located in sub-pixel regions in a same column of the plurality of sub-pixel regions are electrically connected to two data lines; and a first power supply voltage line electrically connected to the pixel driving circuits of sub-pixels in the same column is located between the two data lines.

14. The driving backplane according to claim 13, wherein one of the two data lines is electrically connected to pixel driving circuits of sub-pixel regions in odd rows of sub-pixel regions in the same column, and another of the two data lines is electrically connected to pixel driving circuits of sub-pixel regions in even rows of sub-pixel regions in the same column.

15. The driving backplane according to claim 1, wherein pixel driving circuits in any adjacent sub-pixel regions of sub-pixel regions in a same row are arranged in mirror symmetry.

16. A display panel, comprising:
the driving backplane according to claim 1; and
a light-emitting device disposed in each of the plurality of sub-pixel regions on the driving backplane, the light-emitting device being electrically connected to the pixel driving circuit.

17. The display panel according to claim 16, wherein the driving backplane further has a peripheral region;

the display panel further comprises a scan driver, a light-emitting driver, a data driver, a timing controller, and a plurality of multiplexers disposed in the peripheral region; and each of the plurality of multiplexers corresponds to pixel driving circuits of sub-pixel regions in a column in the plurality of sub-pixel regions; wherein the scan driver is electrically connected to a plurality of gate lines and the timing controller, and the scan driver is configured to output gate scan signals to the plurality of gate lines one by one in response to a signal received from the timing controller;

the light-emitting driver is electrically connected to a plurality of light-emitting control lines and the timing controller, and the light-emitting driver is configured to output light-emitting control signals to the light-emitting control lines one by one in response to the signal received from the timing controller;

the data driver is electrically connected to the plurality of multiplexers and the timing controller, and the data driver is configured to output data signals to the plurality of multiplexers in response to the signal received from the timing controller; and each of the plurality of multiplexers is further electrically connected to the timing controller and two data lines that are electrically connected to pixel driving circuits of sub-pixel regions in a same column corresponding to each of the plurality of multiplexers, and each of the plurality of multiplexers is configured to transmit a data signal from the data driver to one of the two data lines and another of the two data lines in different time periods in response to the signal received from the timing controller.

* * * * *